United States Patent
Yamazaki et al.

(10) Patent No.: US 7,211,454 B2
(45) Date of Patent: May 1, 2007

(54) MANUFACTURING METHOD OF A LIGHT EMITTING DEVICE INCLUDING MOVING THE SOURCE OF THE VAPOR DEPOSITION PARALLEL TO THE SUBSTRATE

(75) Inventors: Shunpei Yamazaki, Tokyo (JP); Keitaro Imai, Kanagawa (JP); Shinji Maekawa, Kanagawa (JP); Makoto Furuno, Kanagawa (JP); Osamu Nakamura, Kanagawa (JP); Masakazu Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 256 days.

(21) Appl. No.: 10/894,434

(22) Filed: Jul. 20, 2004

(65) Prior Publication Data

US 2005/0053720 A1   Mar. 10, 2005

(30) Foreign Application Priority Data

Jul. 25, 2003   (JP) .............................. 2003-279860

(51) Int. Cl.
*H01L 21/00* (2006.01)
*H01L 21/84* (2006.01)
*H01L 21/44* (2006.01)

(52) U.S. Cl. ..................... 438/28; 438/149; 438/680; 257/E33.002

(58) Field of Classification Search ............. 438/28, 438/149, 680; 257/E33.002
See application file for complete search history.

(56) References Cited

U.S. PATENT DOCUMENTS

| 2,435,997 | A | 2/1948 | Bennett | 118/727 |
| 3,931,490 | A | 1/1976 | Grothe et al. | 219/121.15 |
| 4,023,523 | A | 5/1977 | Ing | 118/726 |
| 4,187,801 | A | 2/1980 | Monk | 118/727 |
| 4,409,134 | A | 10/1983 | Yamazaki | 257/66 |
| 4,627,989 | A | 12/1986 | Feuerstein et al. | 427/10 |
| 4,897,290 | A | 1/1990 | Terasaka et al. | 427/162 |
| 5,258,325 | A | 11/1993 | Spitzer et al. | 438/107 |
| 5,262,654 | A | 11/1993 | Yamazaki | 257/53 |

(Continued)

FOREIGN PATENT DOCUMENTS

EP   1 113 087 A2   7/2001

(Continued)

OTHER PUBLICATIONS

Tatsuya Shimoda; "Ink-jet Technology for Fabrication Processes of Flat Panel Displays"; *SID 03 Digest*; pp. 1178-1181; 2003.

(Continued)

*Primary Examiner*—William M. Brewster
(74) *Attorney, Agent, or Firm*—Fish & Richardson P.C.

(57) ABSTRACT

The present invention provides an active matrix substrate which can be fabricated at a lower cost and a light emitting device having a large display area fabricated by a vapor deposition system which makes a film with uniform thickness for a large substrate. According to the invention, an organic light-emitting device can be fabricated by performing vapor deposition toward a large substrate provided with a pixel portion (and a driver circuit) including an n-channel TFT having a amorphous silicon film, semi-amorphous semiconductor film or an organic semiconductor film as an active layer.

18 Claims, 14 Drawing Sheets

U.S. PATENT DOCUMENTS

| | | | |
|---|---|---|---|
| 5,429,884 A | 7/1995 | Namiki et al. | 428/690 |
| 5,817,366 A | 10/1998 | Arai et al. | 427/66 |
| 6,132,280 A | 10/2000 | Tanabe et al. | 445/58 |
| 6,179,923 B1 | 1/2001 | Yamamoto et al. | 118/719 |
| 6,237,529 B1 | 5/2001 | Spahn | 118/726 |
| 6,244,212 B1 | 6/2001 | Takacs et al. | 118/723 EB |
| 6,326,726 B1 | 12/2001 | Mizutani et al. | 313/504 |
| 6,355,941 B1 | 3/2002 | Yamazaki et al. | 252/501.1 |
| 6,403,392 B1 | 6/2002 | Burrows et al. | 438/22 |
| 6,482,752 B1 | 11/2002 | Yamazaki et al. | 438/758 |
| 6,864,133 B2 | 3/2005 | Aoki et al. | 438/197 |
| 6,919,158 B2 | 7/2005 | Kawamura et al. | 430/270.1 |
| 2001/0006827 A1 | 7/2001 | Yamazaki et al. | 438/30 |
| 2001/0009154 A1 | 7/2001 | Nguyen et al. | 134/1 |
| 2002/0009538 A1 | 1/2002 | Arai | 427/67 |
| 2002/0011205 A1 | 1/2002 | Yamazaki et al. | 118/620 |
| 2002/0030443 A1 | 3/2002 | Konuma et al. | 313/504 |
| 2002/0167026 A1 | 11/2002 | Azami et al. | 257/200 |
| 2002/0197760 A1 | 12/2002 | Yamazaki et al. | 438/48 |
| 2003/0122140 A1 | 7/2003 | Yamazaki et al. | 427/66 |
| 2003/0124764 A1 | 7/2003 | Yamazaki et al. | 438/46 |
| 2003/0137325 A1 | 7/2003 | Yamazaki et al. | 327/80 |
| 2003/0162314 A1 | 8/2003 | Yamazaki et al. | 438/38 |
| 2003/0194484 A1 | 10/2003 | Yamazaki et al. | 427/66 |
| 2003/0221620 A1 | 12/2003 | Yamazaki | 118/722 |
| 2003/0227253 A1 | 12/2003 | Seo et al. | 313/504 |
| 2004/0016404 A1* | 1/2004 | Gregg et al. | 118/726 |
| 2004/0031442 A1 | 2/2004 | Yamazaki et al. | 118/727 |
| 2004/0035360 A1 | 2/2004 | Yamazaki et al. | 118/715 |
| 2004/0040504 A1 | 3/2004 | Yamazaki et al. | 118/715 |
| 2004/0123804 A1 | 7/2004 | Yamazaki et al. | 118/723 VE |
| 2004/0139914 A1 | 7/2004 | Yamazaki et al. | 118/719 |
| 2004/0216673 A1 | 11/2004 | Sakata et al. | 118/719 |
| 2005/0005848 A1 | 1/2005 | Yamazaki et al. | 118/719 |

FOREIGN PATENT DOCUMENTS

| | | | |
|---|---|---|---|
| JP | 363184323 A * | 7/1988 | |
| JP | 10-041069 | 2/1998 | |
| JP | H10-41069 | 2/1998 | |
| JP | 3065528 | 7/2000 | |
| JP | 2001-93667 | 4/2001 | |
| JP | 2001-247959 | 9/2001 | |
| JP | 2002-060926 | 2/2002 | |
| JP | 2002-335153 | 11/2002 | |
| JP | 2004-035964 | 2/2004 | |
| JP | 02004035964 A * | 2/2004 | |
| WO | WO01-31081 | 5/2001 | |

OTHER PUBLICATIONS

S. Kasouit et al.; "Microcrystalline silicon: An emerging material for AMLCD"; *AM-LCD '03*; pp. 111-114; 2003.

* cited by examiner

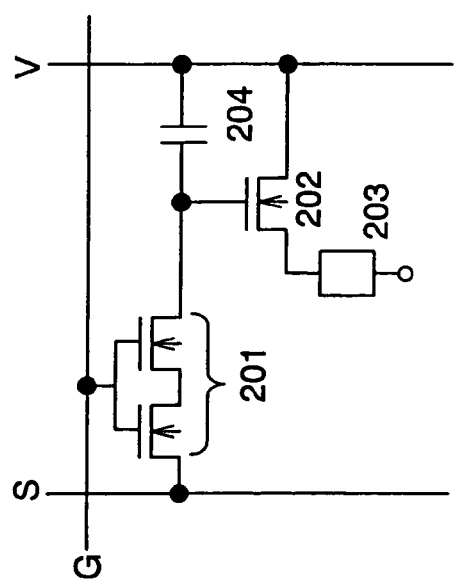
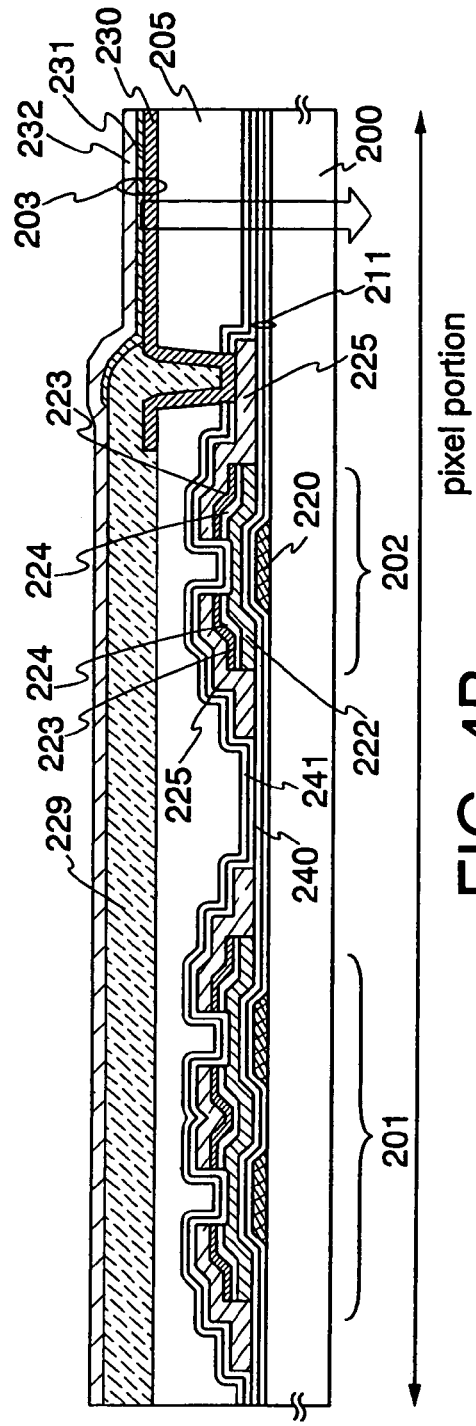
FIG. 4A
FIG. 4B

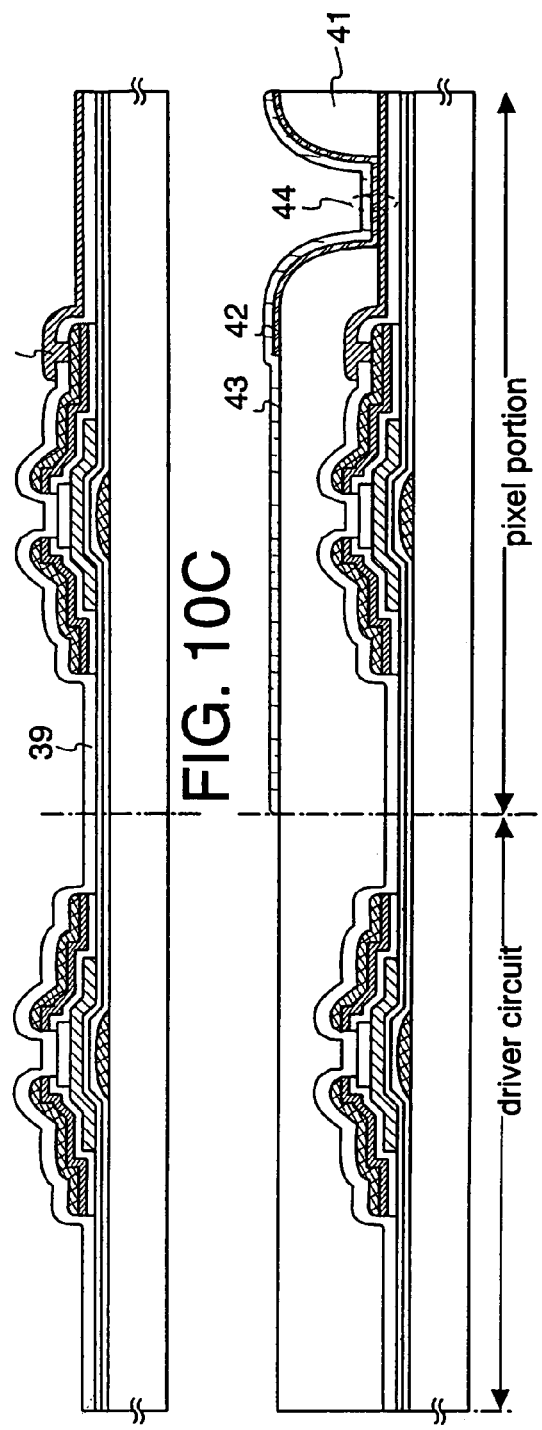

MANUFACTURING METHOD OF A LIGHT EMITTING DEVICE INCLUDING MOVING THE SOURCE OF THE VAPOR DEPOSITION PARALLEL TO THE SUBSTRATE

BACKGROUND OF THE INVENTION

1. Field of the Invention

The present invention relates to a semiconductor device including a circuit fabricated from a thin film transistor (hereinafter, referred to as a TFT) and a manufacturing method thereof. For example, the invention relates to an electronic device equipped with a light emitting display device having an organic light emitting element as a component.

A semiconductor device in this specification refers to a general device which can be operated by using semiconductor properties, and an electro-optic device, a semiconductor circuit, and a electronic device are all referred as a semiconductor device.

2. Description of the Related Art

In recent years, research related to a light emitting device having an EL element as a self-luminous light emitting element has been advanced. The light emitting device is referred to as an organic EL display or an organic light emitting diode. Since these light emitting devices have characteristics such as fast response suitable for movie display, low voltage operation, low power consumption, or the like, they attracts much attention as a next generation display including new generation's cellular phones and personal digital assistants (PDA).

An EL element having a layer containing an organic compound layer as a light emitting layer has a structure in which a layer containing a layer containing an organic compound layer (hereinafter, referred to as an EL layer) is sandwiched between an anode and a cathode. Electroluminescence is generated in the EL layer by applying an electronic field to the anode and the cathode. Luminescence can be obtained from the EL element when a singlet excited state returns back to a ground state (fluorescence) or when a triplet excited state returns to a ground state (phosphorescence).

The EL layer has a layered structure typified by "a hole transporting layer, a light emitting layer and an electron transporting layer". EL materials for forming an EL layer are classified broadly into low-molecular weight (monomer) materials and high-molecular weight (polymer) materials. The low-molecular weight materials are deposited using a vapor deposition (evaporation) system.

A conventional vapor deposition system has a substrate holder where a substrate is set, a crucible (an evaporation boat) encapsulating an EL material, that is a deposition material, a shutter for preventing the EL material to be sublimed from rising, and a heater for heating the EL material in a container. Then, the EL material heated by the heater is sublimed and deposited on a rotating substrate. At this time, the distance between the substrate and the crucible needs to be 1 m or more so as to perform uniform deposition.

As to a conventional vapor deposition system and a conventional vapor deposition method, when an EL layer is formed by vapor deposition, almost all the sublimed EL material is adhered to an inner wall of a film formation chamber of the vapor deposition system, a shutter or an adherence preventive shield (a protective plate for preventing a deposition material from adhering to an inner wall of the film formation chamber) inside of the film formation chamber. Therefore, in forming the EL layer, an efficiency of utilizing the expensive EL materials is extremely low i.e. about 1% or less, and thus, manufacturing costs of a light emitting device has been very high.

As to a conventional vapor deposition system, in order to provide a film with uniform thickness, it is necessary to separate a substrate from a source of the vapor deposition 1 m or more. Therefore, the vapor deposition system has grown in size, a period required for exhausting each film formation chamber of the vapor deposition system has been prolonged; thus, film formation speed is slowed down and throughput is reduced. Also, in using a large substrate, the film thickness between a center portion and a marginal portion of a substrate easily becomes uneven. Further, the vapor deposition system has a structure for rotating a substrate; therefore, there is a limit in a vapor deposition system for a large substrate.

In view of the above-described problems, the present inventors have proposed a vapor deposition system (Reference 1: Japanese Patent Laid-Open No. 2001-247959 and Reference 2: Japanese Patent Laid-Open No. 2002-60926).

BRIEF SUMMARY OF THE INVENTION

The present invention provides a vapor deposition system as one of the manufacturing systems that improve the efficiency in the use of an EL material to reduce manufacturing costs and is excellent in uniformity or throughput of forming an EL layer and a vapor deposition method. Further, the present invention provides a light emitting device fabricated by the vapor deposition system and the vapor deposition method according to the present invention and a manufacturing method of the light emitting device.

Further, the invention provides a manufacturing apparatus for depositing an EL material efficiently over a large substrate having a size of, for example, 600×720 mm, 680×880 mm, 1000×1200 mm, 1100×1250 mm, or 1150×1300 mm. Also, the invention provides a TFT substrate which can be fabricated at a lower cost and a light emitting device having a large screen fabricated by a vapor deposition system which makes a film with uniform thickness even on a whole surface of the large substrate.

It is a feature of the present invention that an organic light-emitting device is fabricated by performing vapor deposition toward a large substrate provided with a pixel portion (or a driver circuit) including an n-channel TFT having an active layer of amorphous silicon or a TFT having an active layer of semi-amorphous semiconductor (hereinafter, also referred to as SAS).

According to the invention, vapor deposition is performed while a substrate is fixed and a source of the vapor deposition is moved, thereby forming a film. Distance between the substrate and the source of the vapor deposition is typically narrowed to 30 cm or less, preferably 20 cm or less, more preferably from 5 cm to 15 cm; thus, efficiency in the use of deposition materials and throughput are thus remarkably improved.

In the case where a large substrate is used, a deposition mask should also be larger; therefore, the mask may have deflection about its center part although the mask about a frame where the mask is attached is tightened. In view of the aforementioned problem, an additional wire is provided for the mask so that the mask can be adhered to the substrate without causing deflection by straining the wire. This additional wire preferably uses a different metal from a mask material, for example a shape memory alloy.

According to the invention, a TFT is formed by using a semi-amorphous semiconductor film having an amorphous semiconductor film in which crystal grains are dispersed, and a light-emitting device is manufactured by using the TFT for a pixel portion or a driver circuit. Since the TFT formed by the semiamorphous semiconductor film has mobility of from 2 cm²/Vsec to 10 cm²/Vsec that is 2 to 20 times higher than that of a TFT formed by an amorphous semiconductor film, a part of or all of the driver circuit can be integrally formed over one substrate with a pixel portion.

SAS is a semiconductor having a structure between amorphous and crystal structures (including single crystal and polycrystal). The semiconductor is a semiconductor having a stable state with respect to free energy. Further, the semiconductor is crystalline and has a short distance order and lattice distortion. The grain size of the semiconductor is 0.5 nm to 20 nm and the SAS can be dispersed in a non-single crystal semiconductor. At least one atomic percent or more of hydrogen or halogen is contained in the SAS as a dangling-bond terminator. Further, if a rare gas element such as helium, argon, krypton, or neon is added whereby further promoting lattice distortion, the stability is increased and a SAS of good quality can be obtained.

When an impurity element for controlling a valence electron is intended not to be doped into a SAS, the SAS shows low electrical conductivity of n-type. This is due to impurities contained in the SAS, and it is typically considered that oxygen provides n-type conductivity. Oxygen contained in a SAS varies also according to high-frequency power density during film formation. In the invention, it is preferable that an oxygen concentration in a SAS is $5 \times 10^{19}$ atoms/cm³ or less, preferably $1 \times 10^{19}$ atoms/cm³ or less. Naturally, not all of the oxygen serves as a donor; therefore, in order to control conductivity type, the appropriate amount of an impurity element is to be added.

A semi-amorphous semiconductor film (a microcrystalline conductor film) can be formed directly on a substrate unlike a polycrystalline semiconductor film. Specifically, the SAS can be formed by plasma CVD using $SiH_4$ with $H_2$ diluted in a flow rate of 2 to 1000 times, preferably in a flow rate of 10 to 100 times. The SAS formed according to the above method also includes a microcrystalline semiconductor film containing a crystal grain of 0.5 nm to 20 nm in an amorphous semiconductor. Therefore, there is no necessity to provide a crystallization step after forming a semiconductor film, which differs from the case where a polycrystalline semiconductor is used. In addition, there is no limitation on the size of a substrate in the case of SAS unlike in the case of crystallization using laser light, where there is a limitation on the length of a major axis of a laser beam. In other words, it is possible to easily form the SAS over a substrate of so-called 5 generations in which one side is a meter angle.

Further, in the case of using an amorphous silicon film or a semi-amorphous silicon film as an active layer of a TFT, the number of the steps for forming the TFT can be reduced compared with a TFT using a polycrystalline semiconductor film; thus, yield of a light emitting device can be improved, and the costs can be reduced.

When a semi-amorphous semiconductor film is used as an active layer of a TFT, the channel region is not required to be entirely formed with the semi-amorphous semiconductor film, and it is preferable that at least an active layer part of the gate electrode side is formed of semi-amorphous semiconductor film.

The invention described in this specification discloses a manufacturing method of a light emitting device comprising the steps of: a step for depositing a material containing an organic compound by a source of the vapor deposition provided opposite a substrate; a sep for forming a film containing an organic compound over a first electrode provided on the substrate; and a step for forming a second electrode over the film containing an organic compound; wherein the source of the vapor deposition is moved as the first electrode connected to a TFT including an amorphous semiconductor film or a semi-amorphous semiconductor film as an active layer is parallel to one side of each of pixel portions arranged in matrix, so that a film containing an organic compound is formed over the first electrode, and the second electrode is formed over the film containing an organic compound.

According to the above constitution, in the case of obtaining plural panels from one substrate, the pixel portions are plurally arranged parallel or in matrix.

Further, according to the above composition, distance between the source of the vapor deposition and the substrate is 30 cm or below during the deposition.

Further, according to the above composition, the source of the vapor deposition is moved in an X-direction or a Y-direction.

Further, according to the above composition, a plurality of containers is provided for the source of the vapor deposition, and deposition materials are atomized by colliding the deposition materials with each other in a plurality of directions by simultaneously heating the plurality of containers.

Further, according to the above composition, the first electrode is a cathode or an anode of a light emitting element which is electrically connected to the TFT using an amorphous semiconductor film or a semi-amorphous semiconductor film as an active layer.

It is preferable to use a metal, an alloy, an electrically conductive compound, or a mixture of those, which has a small work function (a work function of 3.8 eV or less) for a cathode of a light emitting element. As a specific example of the cathode material, a transition metal that includes a rare-earth metal can be used in addition to an element belonging to Group 1 or Group 2 of the periodic table (an alkali metal such as Li or Cs, or an alkali earth element such as Mg, Ca, or Sr), an alloy (such as Mg:Ag or Al:Li) including the element, and a compound (such as LiF, CsF, or CaF2) including the element, and it is also possible to further stack a metal (including an alloy) such as Al, Ag, or ITO to form the second electrode 103.

It is preferable to use a metal, an alloy, an electrically conductive compound, or a mixture thereof, which has a large work function (a work function of 4.0 eV or more). As a specific example of an anode material, a metal such as gold (Au), platinum (Pt), titanium (Ti), nickel (Ni), tungsten (W), chromium (Cr), molybdenum (Mo), iron (Fe), cobalt (Co), copper (Cu), palladium (Pd), or a nitride of a metal material (such as TiN) can be used in addition to ITO (indium tin oxide), ITSO, zinc oxide, (ZnO), or IZO (indium zinc oxide) in which indium oxide is mixed with 2% to 20% of zinc oxide (ZnO).

In the case of using ITO obtained by sputtering, the surface has minute depressions and projections; accordingly, it is preferable to perform CMP before depositing a layer containing an organic compound. However, in the case of using a large substrate as in the invention, it is difficult to reduce the minute depressions and projections over the entire surface of a substrate by performing CMP. Therefore, it is advantageous to use MoOx or VOx obtained by vapor deposition or sputtering for an anode instead of ITO since CMP needs not to be performed. Further, in the case where the anode is MoOx or Vox, it is preferable that a terminal electrode (a pad for connection with FPC, formed outside of a pixel portion) formed concurrently with the anode be also formed of MoOx or VOx.

When a layer containing an organic compound is deposited over a cathode, it is advantageous to use a cathode material containing a substance represented by the general formula 1 and at least one of an alkali metal, an alkali earth metal, and a transition metal at from 1:0.1 to 1:10 (molar ratio), more preferably from 1:0.5 to 1:2 (molar ratio) since CMP needs not to be performed.

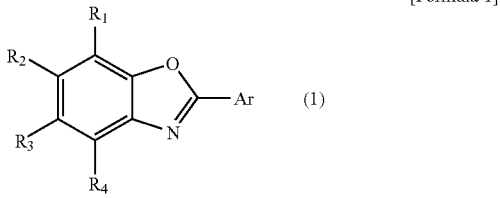

[Formula 1]

In the formula, Ar represents an aryl group, and R1 to R4 individually represent hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic residue.

Specifically, the benzoxazoles (BzOs) represented by the general formula 1 is doped with Li, Na, K, Rb, Cs, Fr, Mg, Ca, Sr, Ce, or Yb to form a cathode. For example, the cathode is formed by co-evaporation while the molar ratio of the benzoxazoles to Li that is an alkali metal is 1:2.

Further, it is advantageous to use another cathode material containing a substance represented by the general formula 2 and at least one of an alkali metal, an alkali earth metal, and a transition metal at from 1:0.1 to 1:10 (molar ratio), more preferably from 1:0.5 to 1:2 (molar ratio) since CMP needs not to be performed.

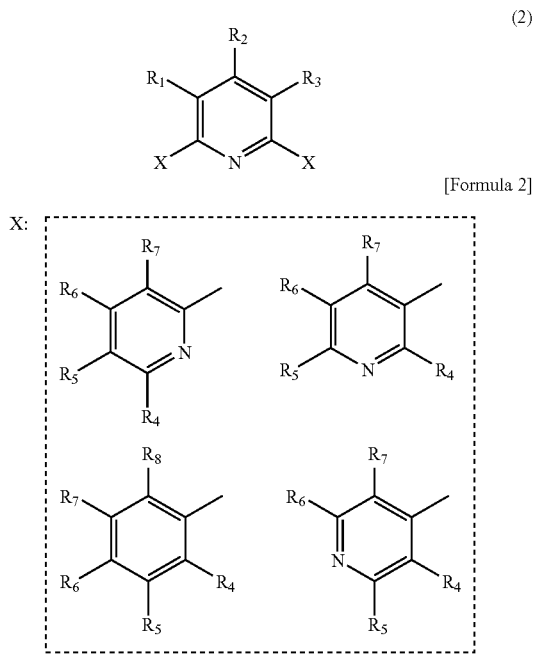

[Formula 2]

In the formula, two Xs in the structure may either be the same or different. R1 to R8 individually represent hydrogen, halogen, a cyano group, an alkyl group (having 1 to 10 carbon atoms), a haloalkyl group (having 1 to 10 carbon atoms), an alkoxyl group (having 1 to 10 carbon atoms), a substituted or unsubstituted aryl group, or a substituted or unsubstituted heterocyclic residue.

Specifically, pyridines (PY) represented by the general formula 2 is doped with Li, Na, K, Rb, Cs, Fr, Mg, Ca, Sr, Ce, or Yb to form a cathode. For example, the cathode is formed by co-evaporation the molar ratio of the pyridines to Li that is an alkali metal is 1:2.

Since the benzoxazoles or the pyridines is a material that is superior in electron injection and is hard to be crystallized in film formation, a light-emitting element that has superior characteristics and a long lifetime can be fabricated.

Further, a light emitting element can be fabricated without using ITO if MoOx or VOx is used for the anode, and benzoxazoles doped with one of an alkali metal, alkaline earth metal, and a transition metal or pyridines is used for the cathode.

It is a feature of the above structure that an amorphous semiconductor film or a semi-amorphous semiconductor film is formed by CVD using silicide gas.

Further, a TFT may be formed by ink-jet, and another composition of the invention discloses a manufacturing method of a light emitting device comprising the steps of: a step for depositing a material containing an organic compound by a source of the vapor deposition provided opposite a substrate; a sep for forming a film containing an organic compound over a first electrode provided on the substrate; a step for forming a second electrode over the film containing an organic compound; a step for forming a first conductor; forming and stacking a first semiconductor and a first insulator over the first conductor, and thereafter patterning the first semiconductor by using a first pattern; forming a second insulator in contact with the patterned first semiconductor, and thereafter patterning the second insulator by using a second pattern; a step for forming and stacking a the second semiconductor and a third semiconductor over the second insulator; a step for forming a second conductor so as to be in contact with the third semiconductor, and thereafter forming a TFT by patterning the second semiconductor and the third semiconductor using the second conductor as a mask; a step for forming a first electrode in contact with the second conductor; a step for forming a film containing an organic compound over the first electrode by moving the source of the vapor deposition; and a step for forming a second electrode over the film containing an organic compound; wherein a semi-amorphous semiconductor is formed as the first semiconductor and the third semiconductor, the first pattern and the second pattern are formed by selectively discharging a composition containing an organic resin, and the first conductor and the second conductor are formed by selectively discharging a composition containing a conductive material.

According to the above constitution, an impurity element which provides n-type conductivity is doped into the second and the third semiconductors.

According to the above constitution, the composition contains silver, gold, copper or indium tin oxide.

According to the above constitution, the first and the second patterns are made of one in which a photosensitive agent is resolved in a solvent is used.

Further, it is a feature of the invention that on the occasion of forming a TFT, a pattern is formed by selectively discharging a composition by a droplet discharge method (ink-jet method). It is another feature of the invention that a semiconductor or the like is patterned with the use of a pattern which is formed only in the desired area by the droplet discharge method.

In addition, it becomes possible to form a TFT without using a resist mask at all or only using a few by using a droplet discharge method. Therefore, steps such as resist application, resist baking, exposure, development, baking after development, and resist removal can be eliminated, so that significant reduction in costs or improvement in reliability can be realized due to the simplification of a process flow.

According to the invention, loss of a deposition material is reduced by means of a vapor deposition system suitable for mass production using a large substrate, and the manufacturing costs of the whole light emitting device can be reduced.

Further, according to the invention, an amorphous semiconductor film or a semi-amorphous semiconductor film, which is suitable for mass production using a large substrate is used for an active layer of a TFT, so that a step for crystallizing a semiconductor film after the film formation can be omitted; thus, manufacturing costs can be reduced.

When a semi-amorphous semiconductor film is used as an active layer of a TFT, a driver circuit can be fabricated also with the semi-amorphous semiconductor film, and a system on panel light-emitting device can be obtained without complicating the fabrication process of a TFT.

Further, an amorphous TFT substrate can be fabricated with the use of an existing production line by using an amorphous semiconductor film for an active layer of a TFT; thus, equipment costs can be reduced.

BRIEF DESCRIPTION OF THE DRAWING

FIGS. 4A and 4B respectively show a circuit diagram and a cross-sectional view of a pixel in a light emitting device of the invention. (Embodiment 1)

FIGS. 10A to 10D are figures showing manufacturing steps of a light emitting device of the invention. (Embodiment 4)

DETAILED DESCRIPTION OF THE INVENTION

Embodiment Mode

An embodiment mode of the invention will be described below. A top view of an example of a vapor deposition system is shown in FIG. 1.

Figure 1:
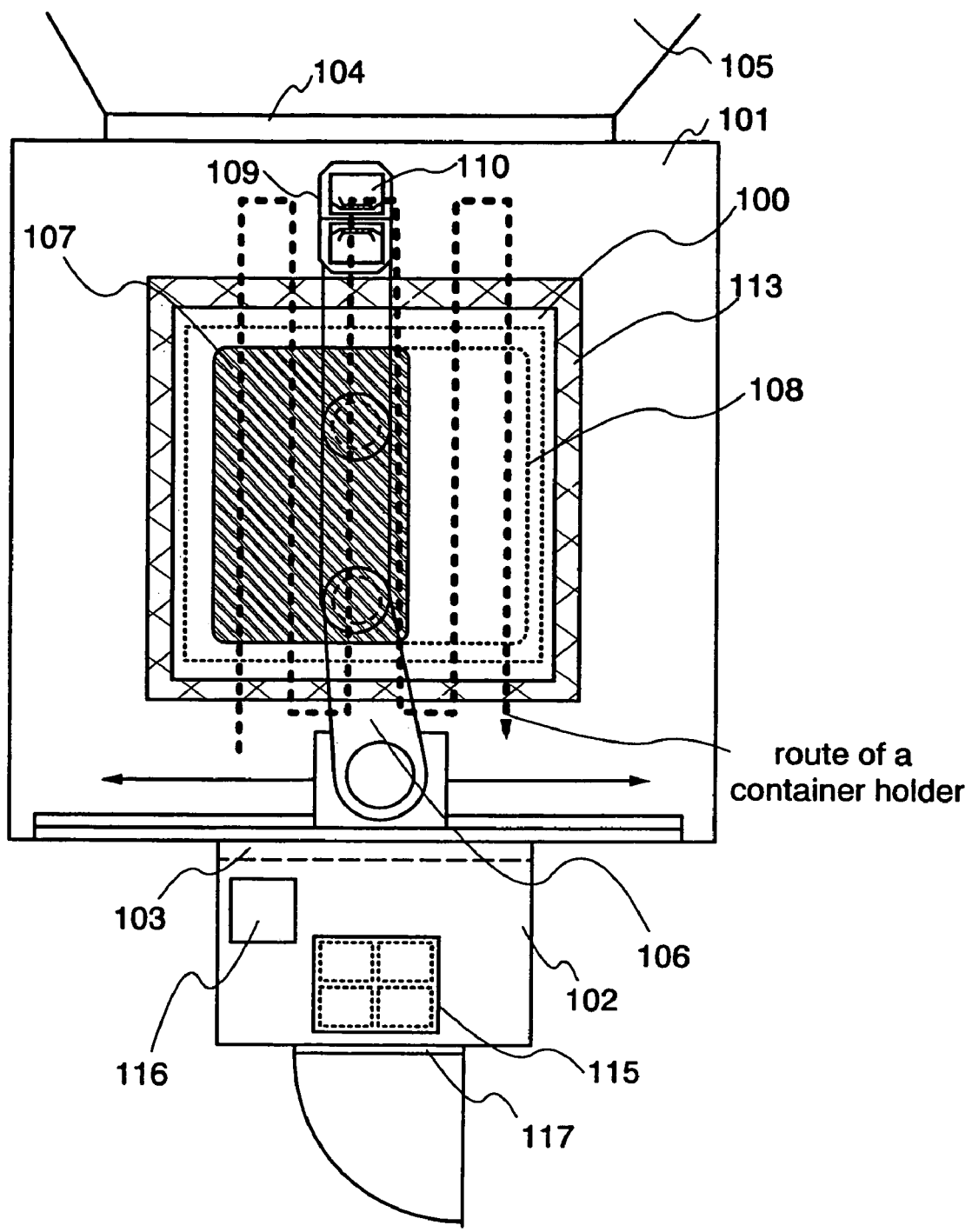
FIG. 1 is a top view of a vapor deposition system of the invention. (Embodiment Mode)

In FIG. 1, reference numeral 100 denotes a large substrate, 101 denotes a film formation chamber, 102 denotes a setting chamber, 103, 104 and 107 denote shutters, 105 denotes a transfer chamber, 106 denotes a robot arm, 107 denotes a deposited region, 108 denotes a portion to be a panel, 109 denotes a container holder, 110 denotes a container (a material container), 115 denotes a container storage place, and 116 denotes a unit for setting containers. Here, an example of a rectangular container is shown; however, the shape is not particularly limited thereto and the container may be cylindrical and so on.

Further, a first electrode (a cathode or an anode) and an insulator (a bank) covering an end portion of the first electrode are provided for the large substrate 100 in advance, and a plurality of TFTs (current control TFTs) each connected to the first electrode and other TFTs (switching TFTs) are further provided. Further, the TFTs are n-channel TFTs each having an amorphous silicon film as an active layer, TFTs each having a semi-amorphous semiconductor film (a microcrystalline semiconductor film) or TFTs each having an organic semiconductor film as an active layer.

Here, an example of designing one panel with a screen size of from 22 to 50 inches in the portion 108 over the large substrate 100. Further, a plurality of panels may be designed over the large substrate 100, and dicing may be performed.

Further, a mask 113 is aligned in contact with the large substrate 100. RGB (Red, Green and Blue) are deposited by repeating the alignments and depositions three times shifting a mask by a distance corresponding to one pixel.

Figure 2:
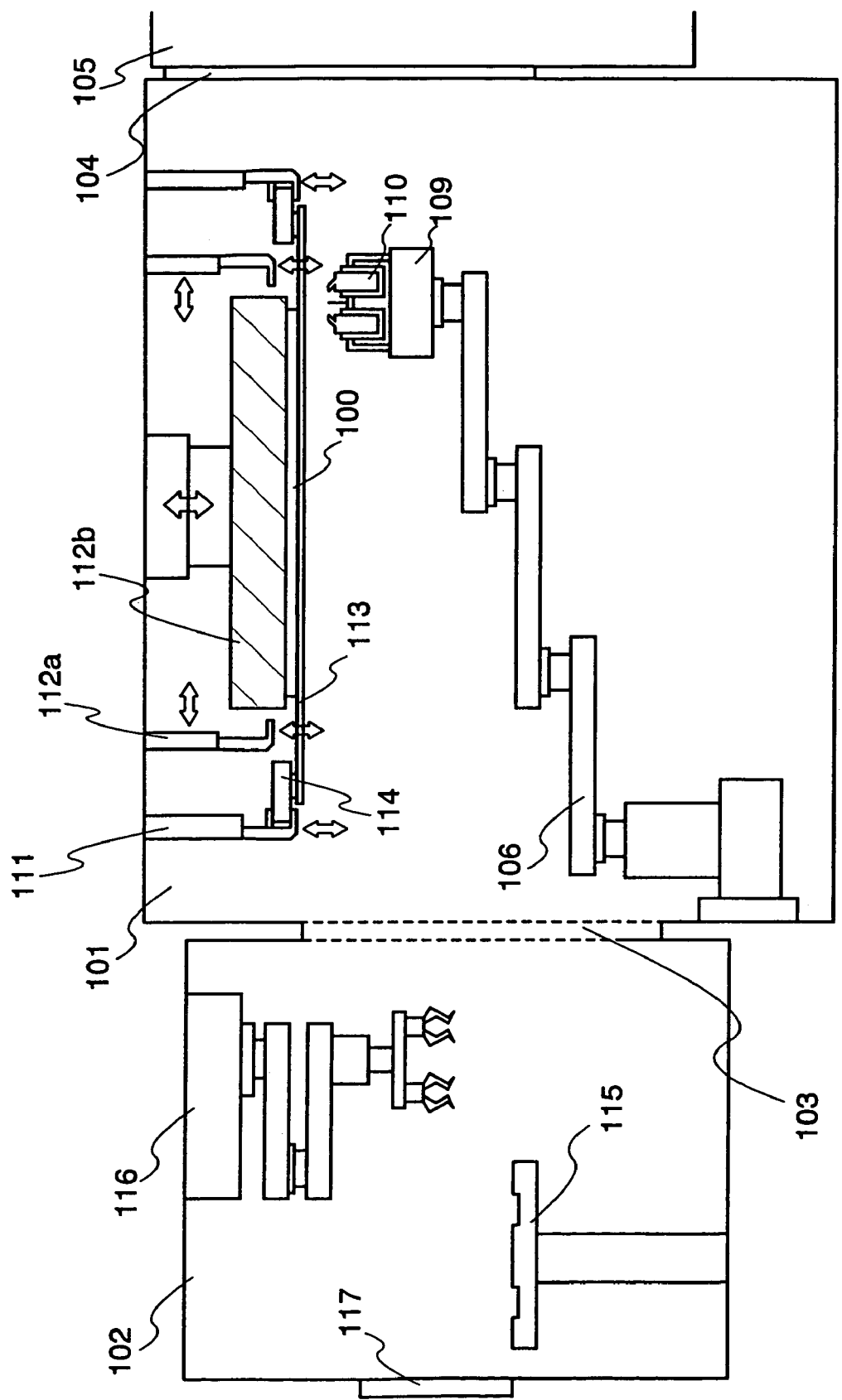
FIG. 2 is a cross-sectional view of a vapor deposition system of the present invention. (Embodiment Mode)

Further, FIG. 2 shows a cross-sectional view of FIG. 1. Parts in FIG. 2 same as ones shown in FIG. 1 are denoted by the same reference numerals.

The mask 113 with a sheet-like shape, having opening portions is fixed to a mask frame 114 with a frame shape by bonding or welding. The deposition is preferably performed during heating at a suitable temperature for the deposition material; further, the position to fix the mask may be determined so that appropriate tension is applied to the mask at the heating temperature. Further, alignment with the large substrate 100 is performed by a mask 113 and a mask holder 111 supporting the mask frame 114. First, a transported large substrate 100 is supported by an alignment means 112a and mounted on the mask holder 111. Subsequently, the large substrate 100 mounted on the mask 113 is carried close to an alignment means 112b, and the large substrate 100 with the mask 113 are clamped to the alignment means 112b by magnetic force. Note that the alignment means 112b has a permanent magnet (not shown) and a heating means (not shown).

Further, vapor deposition is performed over the large substrate 100 while the end of the robot arm 106 is moved in an X-direction, a Y-direction, and Z-direction. The end of the robot arm 106 is provided with the container holder 109, and the container 110 including a deposition material is set on the container holder 109.

When the container 110 is loaded on the container holder 109, the container placed on the container storage place 115 is loaded on the container holder 109 in the film formation chamber 101 from outside the film formation chamber 101 by the unit for setting containers 116. It is preferable to move the robot arm 106 so as to easily load the container. Vacuum can always be maintained in the film formation chamber 101 by providing the setting chamber 102, and by appropriately switching between vacuum and atmospheric pressure in the setting chamber 102.

Further, when co-evaporation is performed, it is preferable that the container holder 109 has a system where the angles of the containers and heaters surrounding the containers can be varied freely to change a deposition position on the large substrate 100. Note that, some distance is required between the two containers to incline the whole containers and the heaters. Accordingly, as shown in FIGS. 3A to 3E, it is preferable to use rectangular column shape containers, to decide the deposition position according to the aperture directions, to collide evaporation materials, and to make the evaporation materials fine particles. The container includes an upper part and a lower part. Upper parts where deposition materials are ejected from apertures having different opening angles are prepared and should be selected appropriately. The two containers each attached with a different upper part should be used because each evaporation material has a different characteristic, i.e. expansion rate of deposition, for example.

It is important to mix two kinds of evaporation materials in a co-evaporation process. In the case of using containers shown in FIGS. 3A to 3E, a film can be formed over a large substrate by mixing evaporation materials right after the evaporation materials are ejected from apertures of the containers. In particular, in the case of using a vapor deposition system shown in FIG. 2, distance between the large substrate and the aperture of the container can be narrowed to 30 cm or less and preferably, 20 cm or less, and more preferably 5 cm to 15 cm; thus, efficiency in the use of the evaporation materials can be improved remarkably.

Figure 3A:
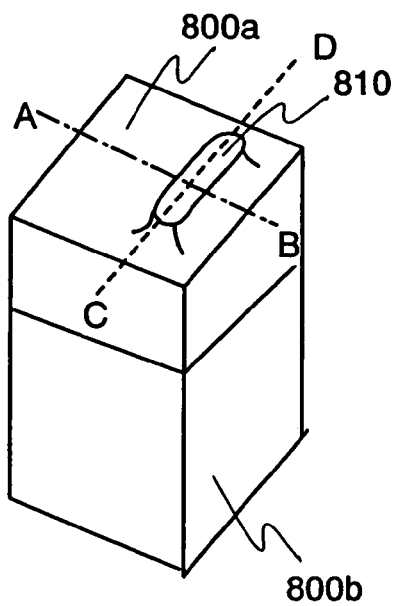
FIGS. 3A to 3E are figures showing examples of containers of the present invention. (Embodiment Mode)
Figure 3B:
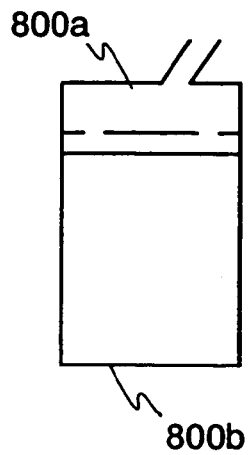
Figure 3C:
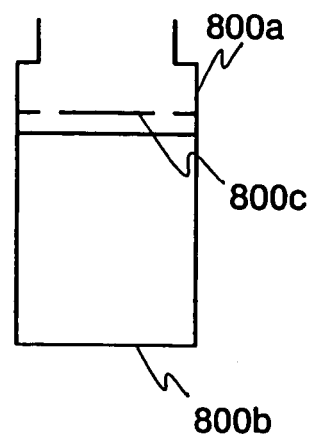

FIG. 3A is a perspective view of a container, FIG. 3B is a cross-sectional view taken along line A–B in FIG. 3A, and FIG. 3C is a cross-sectional view taken along line C–D in FIG. 3A.

If the setting angles of containers are changed, the containers and heaters surrounding them should also be inclined. Accordingly, when co-evaporation is performed using two containers, distance between the containers is increased. When the distance is too large, it is difficult to mix two different evaporation materials uniformly. Further, if the deposition is performed while the distance between the containers and the large substrate is small, it becomes difficult to obtain a uniform film.

The deposition position is preferably decided by an angle of an aperture 810 of an upper part 800a rather than changing setting angles of containers. A container is composed of an upper part 800a, a lower part 800b and an inner lid 800c. Many small holes are formed in the inner lid 800c, and an evaporation material is passed through the small holes during the evaporation process. Further, containers are made of sintered BN, sintered BN—AlN composites, quartz or graphite, and so on, therefore the containers have resistance to high-temperature, high pressure, and reduced pressure. The containers should be preferably selected in view of the area of the aperture 810, a guide portion of an aperture and a position of an aperture because each evaporation material has different characteristics in deposition direction and the way of expanse.

Figure 3D:
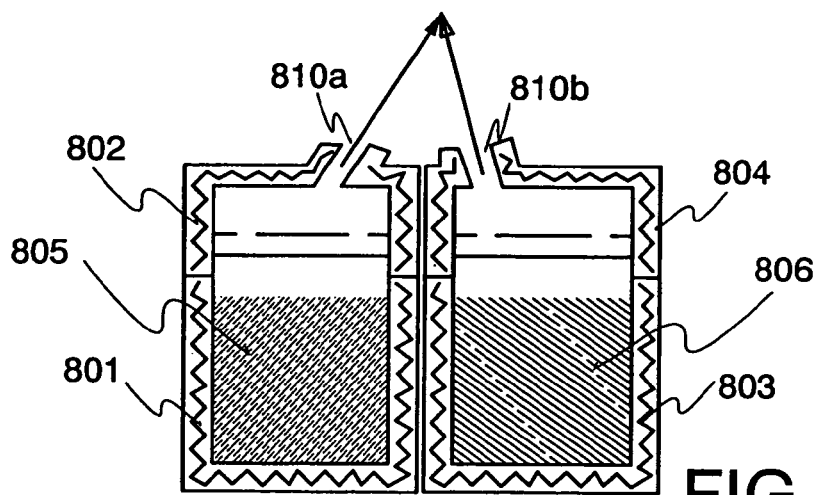

The deposition position can be changed without inclining containers by using the containers of the invention. Further, deposition can be performed uniformly by closely facing apertures 810a and 810b one another and positioning evaporation materials (material A 805 and material B 806) during co-evaporation as shown in FIG. 3D. Each of heaters 801–804 in FIG. 3D is connected to a different power supply, and thermoregulation is performed independently. Further, a uniform film can be obtained even when distance between the aperture of the container and a large substrate is narrowed to 20 cm or less.

Figure 3E:
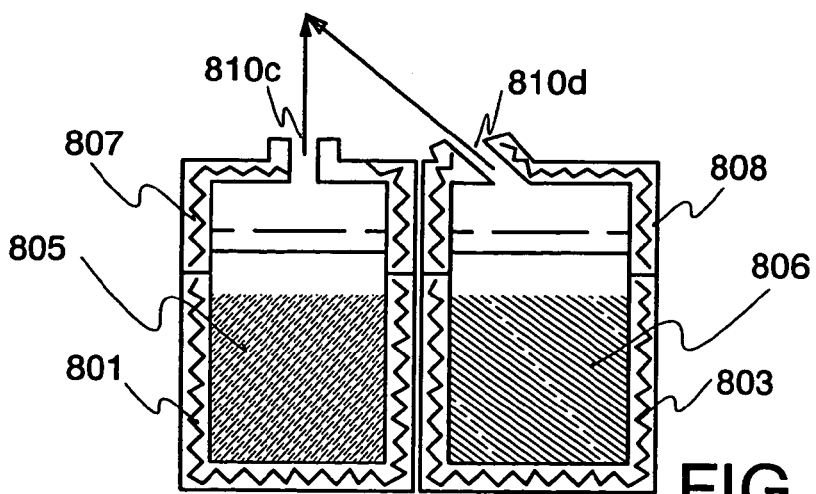

An example different from FIG. 3D is shown in FIG. 3E. FIG. 3E shows an example in which evaporation is performed using an upper part having an aperture 810c where evaporation is performed, which is in the vertical direction, and another upper part having an aperture 810d where evaporation is performed inclined in the direction corresponding to the vertical direction. Also in FIG. 3E, each of heating means 801, 803, 807 and 808 is connected to a different power supply, and thermoregulation is performed independently.

The containers of the invention shown in FIG. 3A to 3E are suitable for performing uniform deposition while fixing the large substrate since they have elongated shape apertures, and larger area can be deposited uniformaly.

In addition, a multi-chamber manufacturing apparatus including the vapor deposition system shown in FIG. 1 as a chamber may be used. Further, the vapor deposition system shown in FIG. 1 can be provided as a chamber of an in-line manufacturing system.

Detailed description of the invention having the above constitution will be explained with embodiments below.

Embodiment 1

FIG. 4A shows a mode of a circuit diagram of a pixel, and FIG. 4B shows a cross-sectional view of a TFT used for a pixel portion. Reference numeral 201 denotes a switching TFT for controlling input of a video signal to a pixel. Reference numeral 202 denotes a driving TFT for controlling the supply of current to a light-emitting element 203. Specifically, drain current of the driving TFT 202 is controlled depending on the voltage of a video signal input to a pixel via the switching TFT 201, and the drain current is supplied to the light-emitting element 203. In addition, reference numeral 204 denotes a capacitor element for holding the voltage between a gate electrode and a source electrode (hereinafter, gate voltage) when the switching TFT 201 is turned OFF. The capacitor element 204 is not necessarily provided.

In FIG. 4A, the gate electrode of the switching TFT 201 is connected to a scan line G. Either the source region or the drain region of the switching TFT 201 is connected with a signal line S, and the other is connected with the gate electrode of the driving TFT 202. Either the source region or the drain region of the driving TFT 202 is connected to a power line V, and the other is connected with a pixel electrode 230 of the light-emitting element 203. One of the two electrodes of the capacitor element 204 is connected to the gate electrode of the driving TFT 202, and the other is connected to the power line V.

FIGS. 4A and 4B show a switching TFT 201 having a multi-gate structure in which a first semiconductor film is shared by two TFTs connected with the switching TFT 201 in series and the two gate electrodes are connected. According to the multi-gate structure, off-state current of the switching TFT 202 can be reduced. Specifically, FIGS. 4A and 4B shows the switching TFT 201 having the structure that two TFTs are connected in series; however, a multi-gate structure may be adopted, in which three or more of TFTs are connected with each other in series, and gate electrodes thereof are connected. Further, the switching TFT is not necessarily formed to have a multi-gate structure. The switching TFT may be a single gate TFT having one gate electrode and one channel region.

TFTs 201 and 202 have structures of inverted staggered type (bottom gate type). An amorphous semiconductor film, a semi-amorphous semiconductor film or an organic semiconductor film is used for each active layer of the TFTs.

When a semi-amorphous semiconductor film is used for the active layers, a driver circuit as well as a pixel portion can be formed over one substrate. N-type TFT has higher mobility than p-type TFT, thus suitable for the driver circuit; however, each TFT may either be n-type or p-type. In both cases, all the TFTs formed over one substrate desirably have one same conductivity so as not to increase the number of steps.

The driving TFT 202 of the pixel portion includes a gate electrode 220 formed over a substrate 200; a gate insulating film 211 covering the gate electrode 220; and a first semiconductor film 222 formed with a semi-amorphous semiconductor film, which overlaps with the gate electrode 220 with the gate insulating film 211 interposed therebetween. Further, the TFT 202 has a pair of second semiconductor films 223 serving as a source region and a drain region; and third semiconductor films 224 formed between the first semiconductor film 222 and the second semiconductor film 313.

The second semiconductor films 223 are formed with an amorphous semiconductor film, a semi-amorphous semiconductor film or an organic semiconductor film. Impurities providing one conductivity type are provided in the second semiconductor films 223. Further, the pair of the second semiconductor films 223 is provided opposite to each other with a channel region of a first semiconductor film therebetween.

The third semiconductor films 224, each of which is formed by an amorphous semiconductor film, a semi-amorphous semiconductor film or an organic semiconductor film, have the same conductivity type as that of the second semiconductor films 223, and have properties of lower conductivity than that of the second semiconductor films 223. The third semiconductor films 224 serve as LDD regions to relieve an electric field concentrated on the edge of the second semiconductor films 223 serving as drain regions. Thus, hot carrier effects can be prevented. The third semiconductor films 224 can enhance the resistivity of TFTs to improve reliability thereof; however, the third semiconductor films 224 are not necessarily formed. In the case where the TFT 202 is an n-type TFT, n-type impurities are doped during forming the third semiconductor films 224. Therefore, in the case where the TFT 202 is an n-type TFT, n-type impurities are not necessarily doped into the third semiconductor films 224 later. However, impurities providing p-type conductivity may be doped into a channel region of the first semiconductor film to control the conductivity to approximate to i-type as much as possible.

Wirings 225 are formed in contact with the pair of third semiconductor films 224.

A first passivation film 240 and a second passivation film 241, each of which is formed by an insulating film, are formed so as to cover the TFTs 201 and 202, and the wirings 225. The passivation film covering the TFTs 201 and 202 is not limited to two layers. The passivation film may have a single layer, or three or more layers. For example, the first passivation film 240 can be formed by silicon nitride, and the second passivation film 241 can be formed of silicon oxide. By forming the passivation film of silicon nitride or silicon oxynitride, the TFTs 201 and 202 can be prevented from deteriorating due to moisture or oxygen.

The TFTs 201 and 202 and the wirings 225 are covered with a flat interlayer insulating film 205. The flat interlayer insulating film 205 may be an insulating film formed by PECVD (Plasma Enhanced Chemical Vapor Deposition) and planarized, or may be a SiOx film including an alkyl group which can be obtained by an application method using a siloxane polymer.

Further, contact holes reaching the wirings 225 are formed, and pixel electrodes 230 are formed so as to be electrically connected to the wirings 225.

Further, an insulator 229 (also referred to as a bank, a partition, a barrier, a mound or the like) which covers an end portion of the pixel electrode 230 is formed. As for the insulator 229, an inorganic material (for example, silicon oxide, silicon nitride, or silicon oxynitride), a photosensitive or non-photosensitive organic material (for example, polyimide, acrylic resin, polyamide, polyimidoamide, benzocyclobutene or a resist material), or a laminate of these materials, or the like can be used; however, a photosensitive organic resin covered with a silicon nitride film is used in this Embodiment. For example, when a positive type photosensitive acrylic resin is used as an organic resin material, it is preferable that only an upper end portion of the insulating material has a curved surface having a curvature radius. Further, as for the insulator, either a negative type which becomes insoluble in an etchant by light or a positive type which becomes soluble in an etchant by light can be used. Further, a SiOx film including an alkyl group obtained by an application method using a siloxane polymer may also be used for the insulator 229.

Further, an EL layer 231 is formed to be in contact with the pixel electrode 230 of the light emitting element 203. The EL layer 231 has a layered structure, and at least one layer thereof is selectively formed by the vapor deposition system shown in FIG. 1. Loss of a deposition material can be reduced by using a vapor deposition system (an example thereof is shown in FIG. 1) suitable for mass production for large substrates, and the manufacturing costs of the light emitting device can be reduced.

A counter electrode 232 is formed on the EL layer 231. Note that the light emitting element 203 has an anode and a cathode, and one of them is used as a pixel electrode, and the other is used as a counter electrode.

If a transparent conductive film is used for the pixel electrode 230, light from the EL layer 231 is transmitted through the substrate 200 and is sent out in the direction shown with the arrow in FIG. 4B.

In this embodiment, the first semiconductor film 222 including a channel region is formed with a semi-amorphous semiconductor film. Thus, a TFT having high mobility compared with a TFT using an amorphous semiconductor film can be obtained; therefore, a driver circuit and a pixel portion can be formed over one substrate.

Figure 5A:
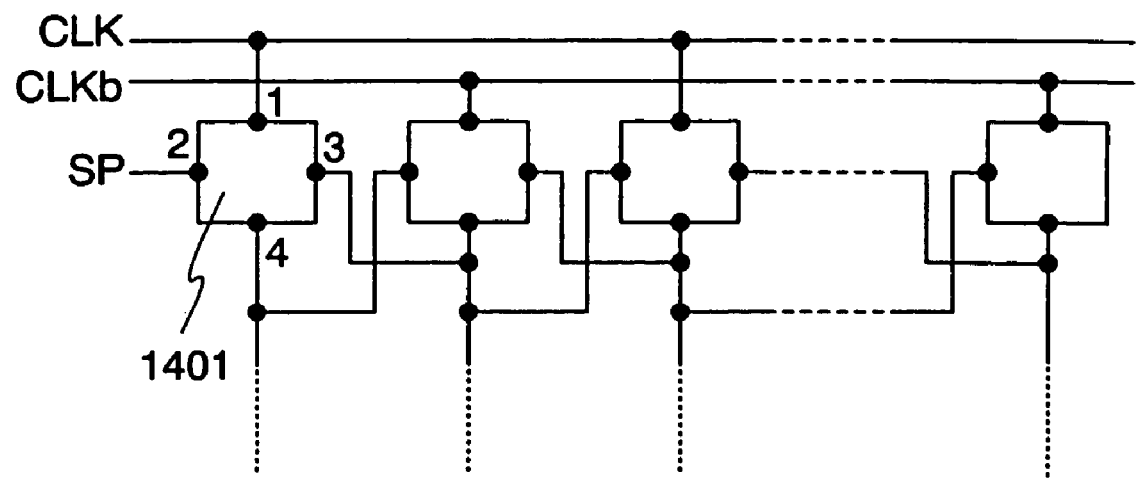
FIGS. 5A and 5B are figures showing one example of a shift register. (Embodiment 1)

Next, a shift resistor, as an example of driver circuits using semi-amorphous TFTs having the same polarity, is explained. FIG. 5A shows the structure of a shift resister according to this embodiment. The shift resister shown in FIG. 5A is operated by using a first clock signal CLK, a second clock signal CLKb, and a start pulse signal SP. Reference numeral 1401 denotes a pulse output circuit. A specific structure of the pulse output circuit 1401 is illustrated in FIG. 5B.

The pulse output circuit 1401 includes TFTs 801 to 806 and a capacitor element 807. A gate electrode of the TFT 801 is connected to a node 2, a source electrode of the TFT 801 is connected to a gate electrode of the TFT 805, and the drain electrode of the TFT 801 is given an electric potential Vdd. A gate electrode of the TFT 802 is connected to a gate electrode of the TFT 806, a drain electrode of the TFT 802 is connected to a gate electrode of the TFT 805, and a source electrode of the TFT 802 is given an electric potential Vss.

A gate electrode of the TFT 803 is connected to a node 3, a source electrode of the TFT 803 is connected to a gate electrode of the TFT 806, and a drain electrode of the TFT 803 is given an electric potential Vdd. A gate electrode of the TFT 804 is connected to a node 2, a drain electrode of the TFT 804 is connected to a gate electrode of the TFT 806, and a source electrode of the TFT 804 is given an electric potential Vss. A gate electrode of the TFT 805 is connected to one of the electrodes of the capacitor element 807, a drain electrode of the TFT 805 is connected to a node 1, and a source electrode of the TFT 805 is connected to the other electrode of the capacitor element 807 and also to a node 4.

Figure 5B:
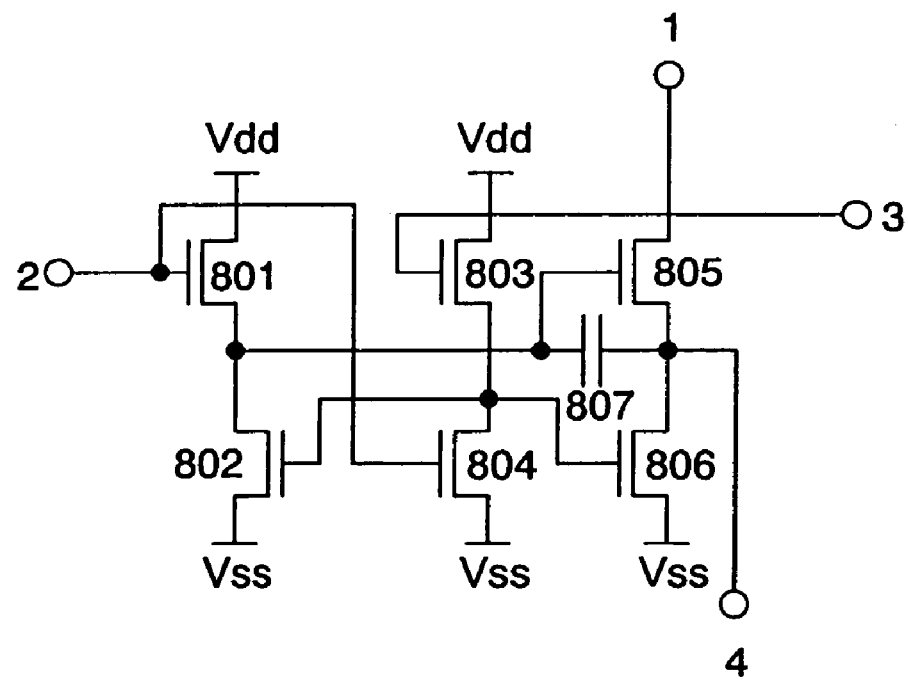

The operation of the pulse output circuit 1401 shown in FIG. 5B is explained. In the case of HIGH level, CLK, CLKb, and SP are Vdd, and in the case of LOW level, the CLK, the CLKb, and the SP shall be Vss.

When the SP becomes HIGH level, the TFT 801 turns ON. Accordingly, electric potential of the gate electrode of the TFT 805 is increased. Eventually, the TFT 801 turns OFF to be a floating state when the electric potential of the gate electrode of the TFT 805 becomes Vdd-Vth (Vth is a threshold voltage of the TFTs 801 to 806). On the contrary, when the SP becomes HIGH level, the TFT 804 turns ON. Accordingly, the electric potential of the gate electrodes of TFTs 802 and 806 are reduced to be Vss eventually, and the TFTs 802 and 806 turn OFF. The gate electrode of the TFT 803 is LOW level at this time, and the TFT 803 is in OFF state.

Then, the SP becomes LOW level, and the TFTs 801 and 804 turn OFF, then, electric potential of the gate electrode of the TFT 805 is held at Vdd-Vth. When the voltage between a gate and a source electrode of the TFT 805 is larger than the Vth (threshold voltage), the TFT 805 turns ON.

When the CLK given to the node 1 changes from LOW level to HIGH level, the node 4, that is the electric potential of the source electrode of the TFT 805, is increased since the TFT 805 turns ON. Since the electric potential between the gate electrode and the source electrode of the TFT 805 is held by the capacitance element 807, electric potential of the gate electrode of the TFT 805 being a floating state is increased again in accordance with the increase of the electric potential of the node 4. Eventually, the electric potential of the gate electrode of the TFT 805 becomes higher than Vdd+Vth, and the electric potential of the node 4 becomes equal to Vdd. The foregoing operation is performed in the pulse output circuit 1401 of the second stage and later, and pulse is output sequentially.

Figure 6A:
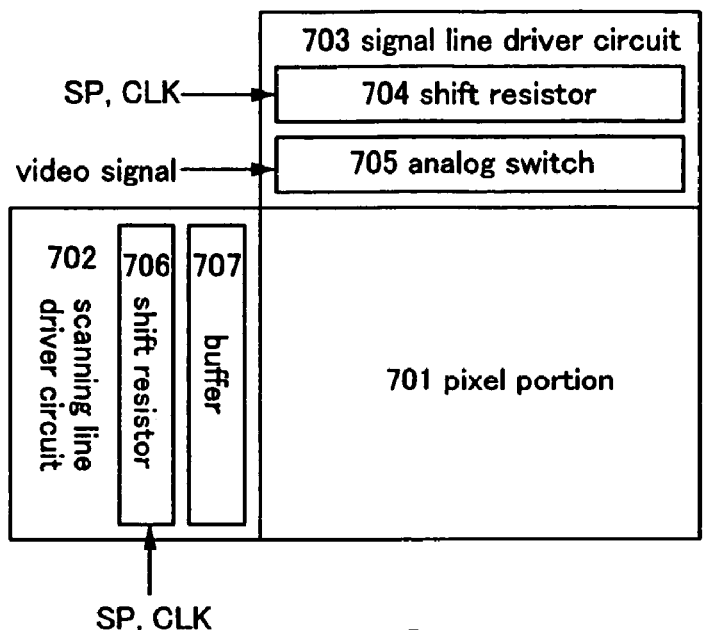
FIGS. 6A and 6B are block diagrams showing structures of light emitting devices of the invention. (Embodiment 1)

FIG. 6A is a block diagram of a light-emitting device according to the invention. A light-emitting device shown in FIG. 6A includes a pixel portion 701 including a plurality of pixels each having a light-emitting element; a scan line driver circuit 702 for selecting each pixel; and a signal line driver circuit 703 for controlling the input signal of a video signal into a selected pixel.

The signal line driver circuit 703 illustrated in FIG. 6A includes a shift resister 704 and an analog switch 705. A clock signal (CLK) and a start pulse signal (SP) are input into the shift resister 704. Upon inputting the clock signal (CLK) and the start pulse signal (SP), a timing signal is generated in the shift resister 704 to be input into the analog switch 705.

A video signal is input to the analog switch 705. The analog switch 705 samples the video signal in accordance with the input timing signal, and supplies the sampled video signal to a signal line at a subsequent stage.

Then, the configuration of a scan line driver circuit 702 is explained. The scan line driver circuit 702 includes a shift resister 706 and a buffer circuit 707. The scan line driver circuit 702 may include a level shifter. A selecting signal is generated in the scan line driver circuit 702 by inputting a clock signal (CLK) and a start pulse signal (SP) to the shift resister 706. The generated selecting signal is buffered and amplified by the buffer circuit 707 and supplied to a corresponding scan line. The scan line is connected with the gate electrode of transistors in one line of pixels. In order to turn the transistors in one line of pixels ON simultaneously, a buffer circuit capable of flowing a large amount of current is used as the buffer circuit 707.

In the case that each video signal corresponding to R (red), G (green) and B (blue) is sampled to be supplied to a corresponding signal line in a full color light-emitting device, the number of terminals for connecting the shift resister 704 to the analog switch 705 is approximately ⅓ of the number of terminals for connecting the analog switch 705 to the signal line of the pixel portion 701. Therefore, by forming the analog switch 705 over one substrate with the pixel portion 701, the generation ratio of connection inferiors can be reduced, the yields can be improved, and the number of terminals used for connecting a substrate formed separately can be reduced compared with the case that the analog switch 705 and the pixel portion 701 are respectively formed over different substrates.

Figure 6B:
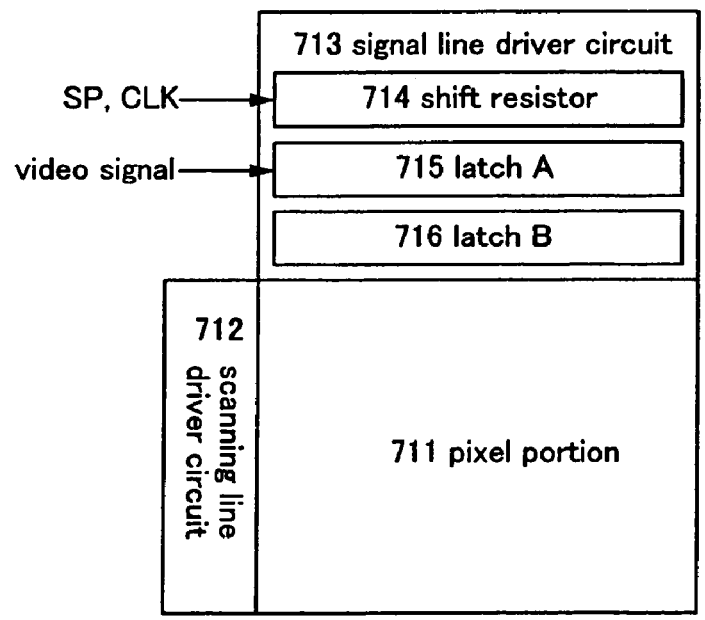

FIG. 6B is a block diagram of a light-emitting device according to the invention, which is different from one shown in FIG. 6A. A signal line driver circuit 713 in FIG. 6B includes a shift resister 714, a latch A 715, and a latch B 716. The scan line driver circuit 712 and a pixel portion 711 have the same structures as ones shown in FIG. 6A.

A clock signal (CLK) and a start pulse (SP) are input to the shift resister 714. Upon inputting the clock signal (CLK) and the start pulse (SP), a timing signal is generated in the shift resister 714 and supplied to the latch A 715 at the first stage in sequence. Upon inputting the timing signal to the latch A 715, a video signal is sequentially written in the latch A 715 in synchronization with the timing signal to be held. Further, the video signal is sequentially written in the larch A 715 in FIG. 6B; however, the invention is not limited to this method. So-called divisional drive method can be performed, that is, the latch A 715 at a plurality of stages is divided in some groups to input a video signal to each group in parallel with each other. In addition, the number of groups is referred to as the number of division. For example, the case that the latch is divided into some groups per four stages is referred to as divisional drive by four-division.

The time required for completing writing a video signal to latches at all stages is referred to as a line period. Practically, the line period may include a horizontal retrace period.

Upon completing one line period, a latch signal is supplied to the latch B 716 at a second state, and a video signal held in the latch A 715 is written in synchronization with the latch signal to be held in the latch B 716. In the latch A 715 which has completed sending a video signal to the latch B 716 at one time, a next video signal is sequentially written in synchronization with the timing signal from the shift resister 714. During the second one line period, a video signal written and held in the latch B 716 is input into a signal line.

The structures illustrated in FIGS. 6A and 6B are only examples. The structures of the signal line driver circuit and the scan line driver circuit are not limited to those shown in FIGS. 6A and 6B.

Further, in the case of forming the first semiconductor film including the channel region with an amorphous semiconductor film, only the pixel portion is formed over the substrate and the driver circuit may be fabricated by bonding an IC chip or the like.

Embodiment 2

Figure 7A:
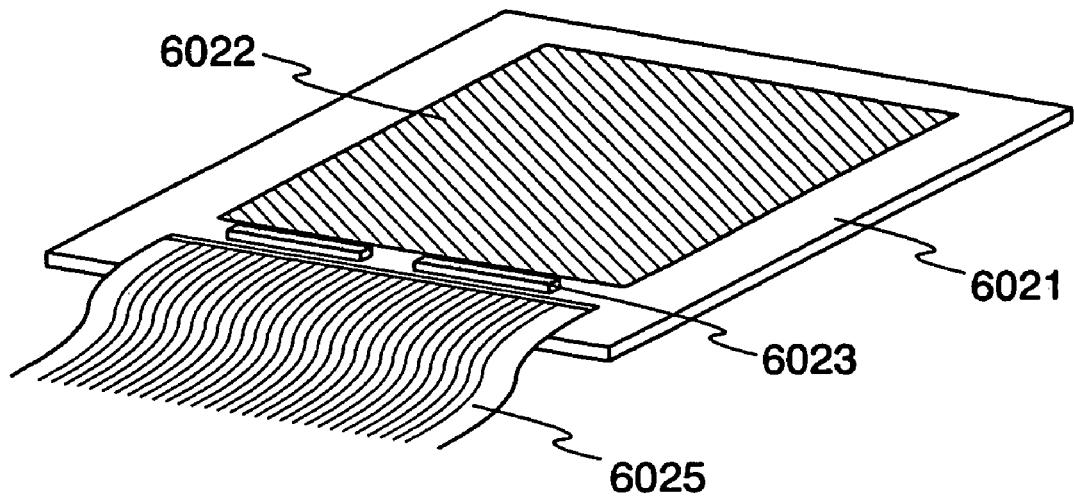
FIGS. 7A and 7B are figures showing active matrix substrates of the invention. (Embodiment 2)

FIG. 7A shows an example of an active matrix substrate where a driver circuit 6023 is formed separately, and the driver circuit is connected to a pixel portion 6022 formed over a substrate 6021. In the case of forming the driver circuit separately, a substrate where the pixel portion is formed is not necessarily bonded to a chip provided with the driver circuit. For example, the chip may be bonded onto an FPC.

The pixel portion 6022 is formed using amorphous TFTs. The signal line driver circuit 6023 is connected to the pixel portion 6022 via connection wirings (not shown) provided over the substrate. An electric potential of a power source, various signals and the like are supplied to the pixel portion 6022, and the driver circuit 6023 respectively via an FPC 6025.

Figure 7B:
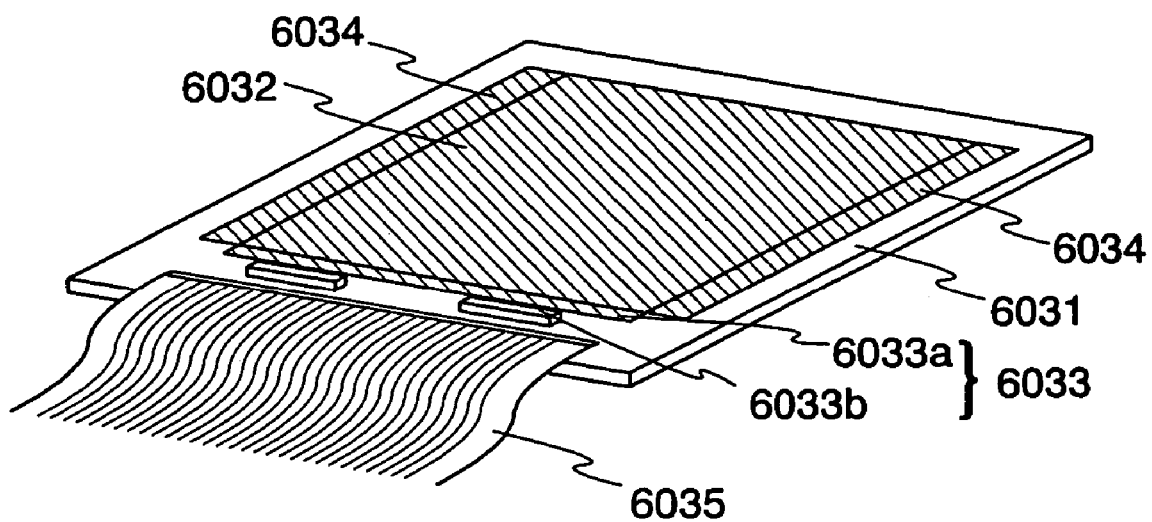

Alternatively, only a part of a signal line driver circuit or a part of a scan line driver circuit may be formed using semi-amorphous TFTs over one substrate with a pixel portion. The rest parts of the signal line driver circuit and the scan line driver circuit may be formed separately and connect electrically to the pixel portion. FIG. 7B shows an example in which an analog switch 6033 included in a signal line driver circuit is formed over a substrate 6031 together with a pixel portion 6032 and a scan line driver circuit 6034, and a shift resister 6033b in a signal line driver circuit is separately formed over a different substrate ande pasted onto the substrate 6031. The pixel portion 6032 and the scan line driver circuit 6034 are formed using semi-amorphous TFTs. The shift resister 6033b in the signal line driver circuit is connected to the pixel portion 6032 via an FPC 6035. The electric potential of a power source, various signals and the like are supplied to the pixel portion 6032, the signal line driver circuit 6033, and the scan line driver circuit 6034, respectively via an FPC 6035.

The method of the connection of the substrate formed separately is not limited; a known COG method, a wire bonding method, a TAB method, or the like can be applied. The position to be connected with the substrate is not limited to those illustrated in FIGS. 7A and 7B as long as electrical connection being possible. Further, a controller, a CPU, a memory, and the like may be separately formed and connected to a substrate.

A signal line driver circuit used in the invention is not limited to an example in which the signal line driver circuit includes only a shift resister and an analog switch. Besides the shift resister and the analog switch, other circuits such as a buffer circuit, a level shifter, and a source follower circuit may be included. Further, the shift resister and the analog switch are not necessarily formed, another circuits such as a decoder circuit capable of selecting a signal line can be used instead of the shift resister, and latch circuit or the like can be used instead of the analog switch.

Embodiment 3

In this embodiment, variations of a pixel formed using an amorphous TFT, a semi-amorphous TFT of an organic TFT which is included in a light emitting device of the invention.

Figure 8A:
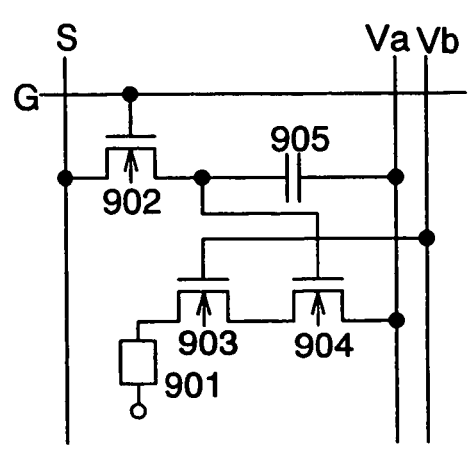
FIGS. 8A to 8E are circuit diagrams of pixels in light emitting devices of the invention. (Embodiment 3)

FIG. 8A shows an example of a pixel according to this embodiment. A pixel shown in FIG. 8A includes a light-emitting element 901, a switching TFT 902 used as a switching element for controlling the input of a video signal to the pixel, a driving TFT 903 for controlling a current value flowing through the light-emitting element 901, and a current control TFT 904 for determining whether to supply current or not to the light-emitting element 901. Moreover, a capacitor element 905 for holding electric potential of a video signal may be provided to the pixel as shown in this embodiment.

The switching TFT 902, the driving TFT 903, and the current control TFT 904, which may be either n-type TFTs or p-type TFTs, have the same polarity. The driving TFT 903 operates in a saturation region and the current control TFT 904 operates in a linear region.

The channel length of the driving TFT 903 is longer than width. The channel length (L) of the current driving TFT 904 is the same as or shorter than the channel width (W). Preferably, the ratio of the channel length to the channel width of the driving TFT 903 is at least 5. In the case of using these TFTs, variation of luminance of the light-emitting element 901 between pixels due to the difference of characteristics of each driving TFT 903 can be reduced. Assuming the channel length of the driving TFT be L1, the channel width of the driving TFT be W1, the channel length of the current driving TFT be L2, and the channel width of the current driving TFT be W2, if L1/W1:L2/W2=X: 1, X is preferably at least 5 and at most 6000. It is preferable that L1/W1=500 μm/3 μm, L2/W2=3 μm/100 μm, for example.

A gate electrode of the switching TFT 902 is connected to a scan line G. Either a source electrode or a drain electrode of the switching TFT 902 is connected to a signal line S, and the other is connected to the gate electrode of the current control TFT 904. A gate electrode of the driving TFT 903 is connected to a second power line Vb. The driving TFT 903 and the current control TFT 904 are connected to a first power line Va and the light-emitting element 901 for supplying current supplied from the first power line Va to the light-emitting element 901 as drain current of the driving TFT 903 and the current control TFT 904. In this example, a source electrode of the current control TFT 904 is connected to the first power line Va, and a drain electrode of the driving TFT 903 is connected to a pixel electrode of the light-emitting element 901.

A source electrode of the driving TFT 903 may be connected to the first power line Va, and a drain electrode of the current control TFT 904 may be connected to a pixel electrode of the light-emitting element 901.

The light-emitting element 901 includes an anode, a cathode, and an EL layer interposed between the anode and the cathode. As shown in FIG. 8A, in the case where the cathode is connected to the driving TFT 903, the cathode serves as a pixel electrode, and the anode serves as a counter electrode. Each counter electrode of the light-emitting element 901 and the first power line Va has an electric potential difference, so that forward bias current is supplied to the light-emitting element 901. The counter electrode of the light-emitting element 901 is connected to an auxiliary electrode.

One of the two electrodes of the capacitor element 905 is connected to the first power line Va, and the other is connected to a gate electrode of the current control TFT 904. The capacitor element 905 is provided to hold an electric potential difference between the gate electrode and the source electrode of the current control TFT 904 when the switching TFT 902 is in the non-selected state (OFF state). FIG. 8A shows the structure in which the capacitor element 905 is provided, but the structure of a pixel shown in FIG. 8A is not restrictive. The capacitor element 905 may not be necessarily provided.

In FIG. 8A, the driving TFT 903 and the current control TFT 904 are n-type TFTs, and a drain electrode of the driving TFT 903 is connected to the cathode of the light-emitting element 901. On the contrary, in the case where the driving TFT 903 and the current control TFT 904 are p-type TFTs, a source electrode of the driving TFT 903 is connected to the anode of the light-emitting element 901. In this case, the anode of the light-emitting element 901 serves as a pixel electrode, and the cathode of the light-emitting element 901 serves as a counter electrode.

Figure 14:
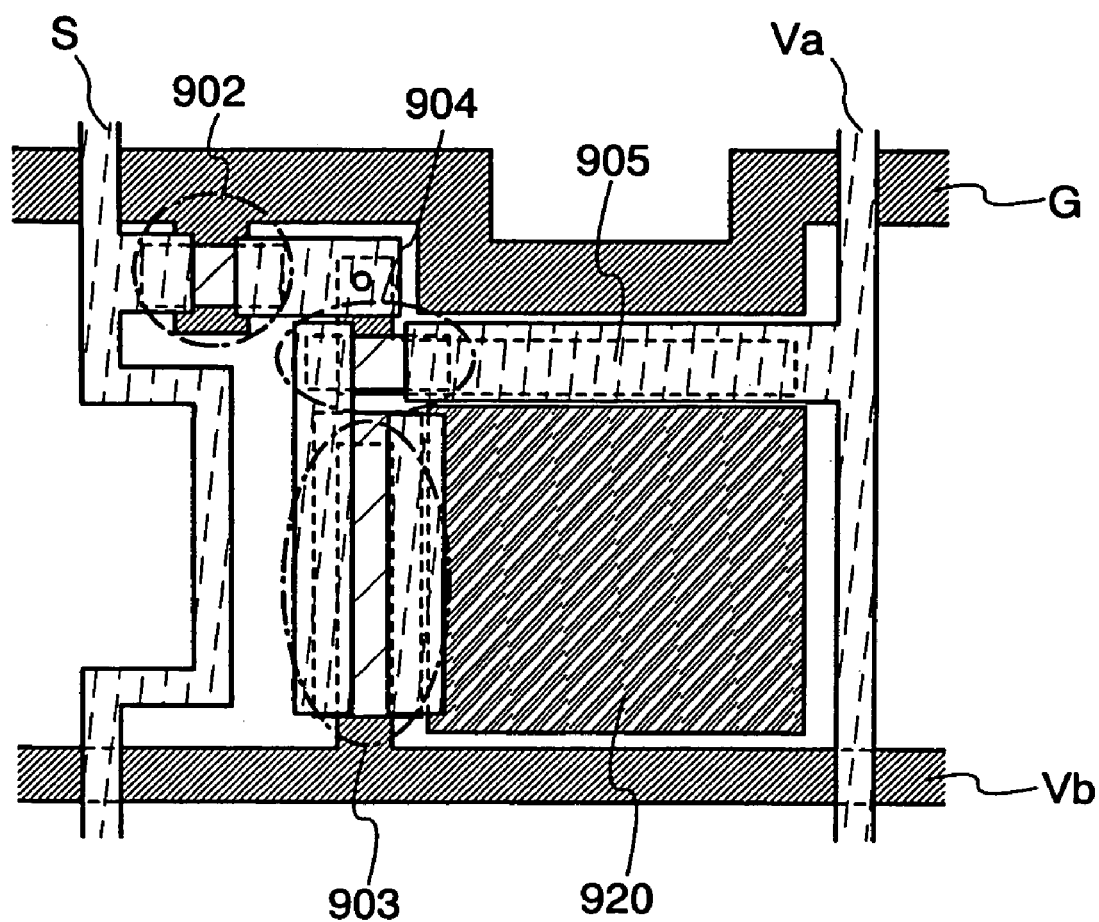
FIG. 14 is a top view of a pixel in a light emitting device of the invention. (Embodiment 3)

A top view of an example of a pixel in FIG. 8A is shown in FIG. 14. Parts in FIG. 14 same as ones shown in FIG. 8A are denoted by the same reference numerals.

Gate electrodes of TFTs 902, 903 and 904, a scan line G, and a second power line Vb, are formed of one conductive film. It is not shown; however, a gate insulating film is formed thereafter, and a first electrode 920 of the light emitting element 901 is formed over the gate insulating film over a base layer. Next, an amorphous semiconductor film or a semi-amorphous semiconductor film by PECVD (Plasma Enhanced Chemical Vapor Deposition) is formed over the entire surface, and the semiconductor film is patterned with a mask so as to have the desired shape. Subsequently, a conductive film formed by sputtering method or PECVD is patterned, and thus, a source wiring and a drain wiring, a signal line S, and a first power line Va are formed. Further, a capacitor element 905 is formed from a gate electrode of the TFT 904, the first power line Va and a gate insulating film interposed therebetween.

Figure 8B:
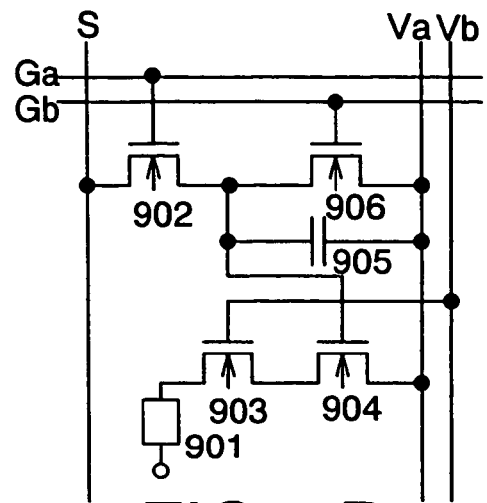

FIG. 8B is a circuit diagram of a pixel shown in FIG. 8A provided with a TFT (erasing TFT) 906 for forcibly turning OFF the current control TFT 904 to the pixel shown in FIG. 8A. In FIG. 8B, same parts are denoted by same numerals as of FIG. 8A. In order to distinguish a first scan line from a second scan line, the first scan line is denoted by Ga and the second scan line is denoted by Gb. A gate electrode of the erasing TFT 906 is connected to the second scan line Gb, and either a source or a drain electrode of the erasing TFT 906 is connected to a gate electrode of the current control TFT 904, and the other is connected to the first power line Va. The erasing TFT 906, which can be either an n-type TFT or a p-type TFT, has the same polarity as that of the other TFTs in the pixel.

Figure 8C:
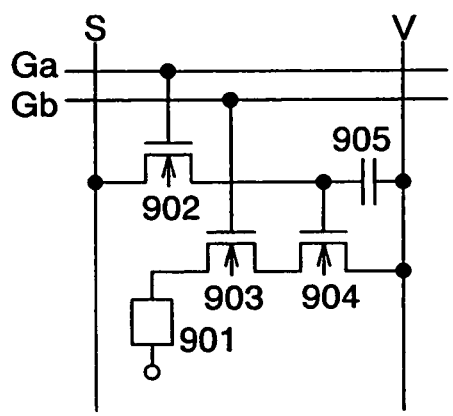

FIG. 8C is a circuit diagram of a pixel in which a gate electrode of the driver circuit 903 is connected to the second scan line Gb different from the pixel shown in FIG. 8A. In FIG. 8C, same parts are denoted by same numerals as of FIG. 8A. As shown in FIG. 8C, light emission from the light-emitting element 901 can be forcibly terminated by switching electric potential to be supplied to a gate electrode of the driving TFT 903 regardless of the information in the video signal.

Figure 8D:
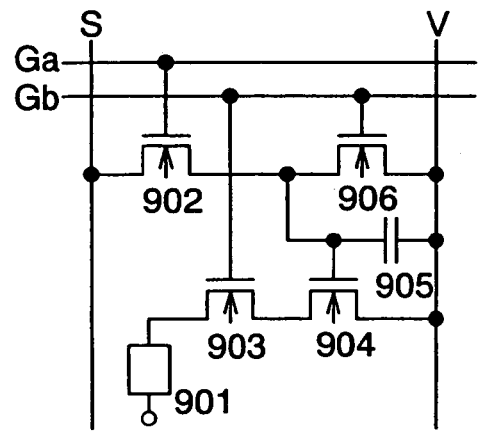

FIG. 8D is a circuit diagram of a pixel with a TFT (erasing TFT) 906 for forcibly turning OFF the current control TFT 904 to the pixel shown in FIG. 8C. In FIG. 8D, same parts are denoted by same numerals as of FIGS. 8A to 8C. A gate electrode of the erasing TFT 906 is connected to the second scan line Gb, and either a source or a drain electrode of the erasing TFT 906 is connected to a gate electrode of the current control TFT 904, and the other is connected to the first power line V. The erasing TFT 906, which can be either n-type or p-type, has the same polarity as that of another TFTs in the pixel.

Figure 8E:
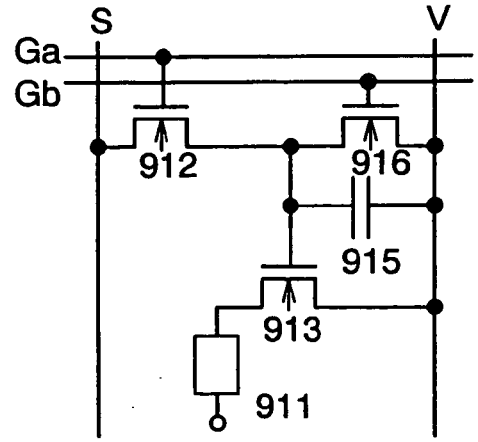

FIG. 8E shows the structure of a pixel without a current control TFT. In FIG. 8E, reference numeral 911 denotes a light-emitting element, 912 denotes a switching TFT, 913 denotes a driving TFT, 915 denotes a capacitor element, and 916 denotes an erasing TFT 916. A gate electrode of the switching TFT 912 is connected to the first scan line Ga, and either a source or a drain electrode of the switching TFT 912 is connected to the signal line S, and the other is connected to a gate electrode of the driving TFT 913. A source electrode of the driving TFT 913 is connected to the power line V, and a drain electrode of the driving TFT 913 is connected to a pixel electrode of the light-emitting element 911. An counter electrode of the light-emitting element 911 is connected to the auxiliary electrode W. A gate electrode of the erasing TFT 916 is connected to the second scan line Gb, and either a source or a drain electrode of the erasing TFT 916 is connected to a gate electrode of the driving TFT 913, and the other is connected to the power line V.

Embodiment 4

A method for forming channel protective type transistors will be described with reference to FIGS. 9A to 10D.

Figure 9A:
FIGS. 9A to 9C are figures showing manufacturing steps of a light emitting device of the invention. (Embodiment 4)

Conductors 11 and 12 for forming gate electrodes and gate wirings (scan lines) are formed over a substrate 10 such as of glass or quartz (FIG. 9A). These conductors 11 and 12 are formed by drawing with a composition containing a conductive material over the substrate 10 by a droplet discharge method. Next, insulators 13 and 14 are formed as gate insulating films over the conductors 11 and 12.

Subsequently, a first semiconductor film 15 is formed over the insulating layers 13 and 14. The first semiconductor film 15 is formed using a semiconductor film with an intermediate structure between an amorphous and crystal structure (including single crystal and polycrystal) (SAS). Rare gas elements such as helium, argon, krypton or neon may be included in this film to promote lattice distortion, thereby increasing stability; therefore, a SAS of good quality can be obtained.

In this embodiment, it is preferable that an oxygen concentration in the first semiconductor film 15 is $5 \times 10^{19}$ atoms/cm$^3$ or less, preferably $1 \times 10^{19}$ atoms/cm$^3$ or less. In addition, impurity elements imparting p-type conductivity are doped into the first semiconductor film 15, in which a channel region is formed, simultaneously with the formation or after the formation, which makes it possible to control threshold voltage. Boron is typically used as an impurity element providing p-type conductivity, and an impurity element such as $B_2H_6$ and $BF_3$ may be mixed with a silicide gas at a rate of 1 ppm to 1000 ppm. Then, a boron concentration may be $1 \times 10^{14}$ to $6 \times 10^{16}$ atoms/cm$^3$.

Figure 9B:
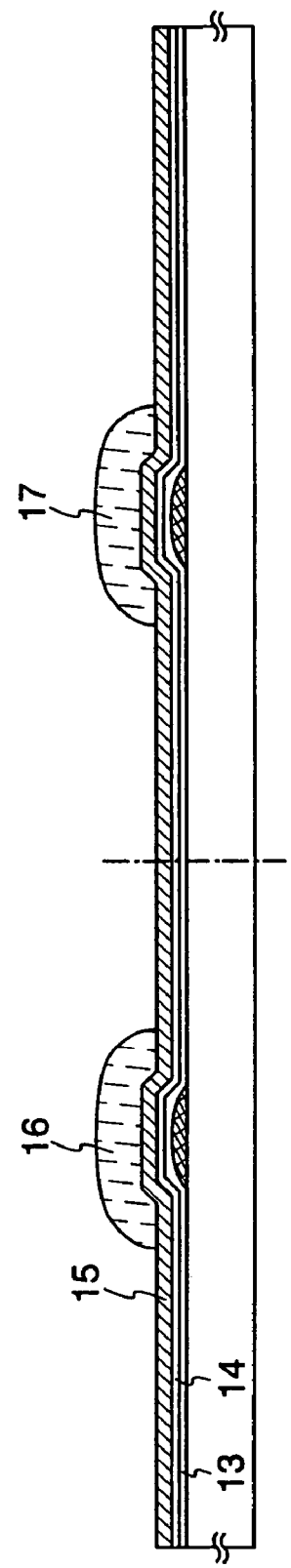
Figure 9C:
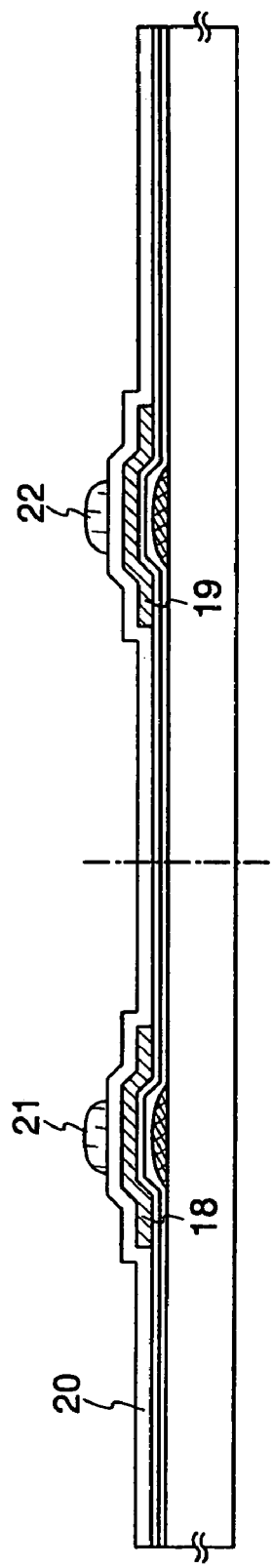

Next, a composition containing a photoresist reacting to ultraviolet radiation is selectively discharged by a droplet discharge method, and thus, patterns 16 and 17 are formed (FIG. 9B). A composition containing a photosensitizer may be used for mask patterns 16 and 17. For example, a typical positive type resist such as a novolac resin and naphthoquinonedi azide compound that is a photosensitizer, a negative type resist such as a base resin, diphenylsilane diol, an acid generation agent, or the like dissolved or dispersed in a known solvent can be used. In addition, an organic material such as acrylics, benzocyclobutene, parylene, flare, polyimide having transmissivity, or a siloxane polymer may be used instead of a resist material.

Then, using the mask patterns 16 and 17 as masks, the first semiconductor film 15 is etched and first semiconductors 18 and 19 are formed. Subsequently, an insulator 20 that serves as a channel protective film is formed over an entire surface.

Next, mask patterns 21 and 22 that serve as masks are formed with a droplet discharge method. (FIG. 9C) Then, the insulator 20 is etched by using the mask patterns 21 and 22 as masks to form insulators 23 and 24. These insulators 23 and 24 serve as channel protective films.

The thin film formed by patterning the insulator 20 is used for channel protective film in this embodiment; however, the invention is not limited thereto. The mask patterns 21 and 22 may be used as channel protective films. In this case, there is no need to carry out an etching step and elimination step of the mask patterns 21 and 22 that are used as the masks; therefore, the steps are simplified, which is preferable.

Further, using a photography step with a light from substrate side can form channel regions without forming mask patterns 21 and 22.

Subsequently, a second semiconductor film 25 is formed over an entire surface. The second semiconductor film 25 is formed without intentionally doping an impurity element to control a valence electron. It is preferable to form the second semiconductor film 25 using a SAS like the first semiconductor film 15. The second semiconductor film 25 has a function as buffer layers by forming between a third semiconductor film 26 having one conductivity type that forms a source region and a drain region and the first semiconductor film 15.

Then, the third semiconductor film 26 is formed on the second semiconductor film 25. In the case of forming n-type transistors, the third semiconductor film 26 having one conductivity type may be doped with phosphorus as a typical impurity element, that is an impurity gas such as $PH_3$ may be mixed with a silicide gas during film formation step. The third semiconductor film 26 having one conductivity type is formed of a semiconductor such as a SAS, an amorphous semiconductor, or a microcrystalline semiconductor, except that a valence electron is controlled. The formed transistor has a structure in which a channel region is not formed between a source and a drain, or between LDD regions, and electric field concentration and current concentration can be relieved.

Next, conductors 27 to 30 are formed on the third semiconductor film 26 by selectively discharging a composition containing conductors by a droplet discharge method. (FIG. 10A) Then, using the conductors 27 to 30 as masks, the second and the third semiconductors 25 and 26 are simultaneously patterned to isolate and form into island shapes. Accordingly, second semiconductor islands 31 to 34 and third semiconductor islands 35 to 38 that are isolated into island shapes are formed. (FIG. 10B)

Through the above steps, the channel protective type transistors are formed. These transistors can achieve field-effective mobility of 2 $cm^2/V \cdot sec$ to 10 $cm^2/V \cdot sec$ by composing a channel region with a SAS. Therefore, theses transistors can be used as switching elements of pixels. Furthermore, the transistors can be used not only as switching elements of pixels but also as elements in a scan line (gate line) driver circuit. Consequently, a system-on-panel can be manufactured.

In addition, as a notable point, resist masks are formed by a droplet discharge method in this process. More specifically, the first semiconductor film 15 is etched with the use of the mask patterns 16 and 17 formed by a droplet discharge method, the insulator 20 is etched with the use of the mask patterns 21 and 22, and the second and third semiconductor films 25 and 26 are etched with the use of the conductors 27 to 30 as masks. Therefore, steps such as applying a resist, baking a resist, exposure, development and baking after development can be eliminated, so that great decrease of cost and increase of reliability due to simplification of the process can be realized.

Subsequently, a method for manufacturing a display device with the use of channel protective type transistors formed through the above steps is described with reference to FIGS. 10C and 10D. A method for manufacturing a display device using light-emitting elements will be described below.

First, an insulating layer 39 is formed over the entire surface with a known method. Then, an opening is formed in a predetermined area of the insulating layer 39 so that the conductive layer 30 is exposed. The masks used in the forming the opening step are formed by existing photolithography or by selectively forming patterns that serves as masks by a droplet discharge method.

Next, a conductive layer 40, which will be a pixel electrode later, is formed by selectively discharging a composition so as to fill the opening. (FIG. 10C)

An insulating layer 41 is formed over the entire surface, and then the opening is formed in a certain area so that the conductive layer 40 is exposed.

Afterwards, an EL layer 42 is formed over a substrate with the use of the vapor deposition system shown in FIG. 1. The EL layer 42 comprises at least one material selected from various organic materials, inorganic materials and the like, and may be preferably formed either of a single layer or a lamination of a plurality of layers. Then, a conductor 43 which serves as a counter electrode is formed on the EL layer 42 by a droplet discharge method. A stack of the conductor 40, the EL layer 42 and the conductor 43 is equivalent to a light-emitting element 44. (FIG. 4D)

In forming this light-emitting element 44, a plurality of thin films of the EL layer 42 and the conductor 43 can be formed continuously by changing compositions discharged from a nozzle or by changing heads each filled with a composition. Accordingly, throughput is improved, which is preferable for improving the productivity.

Embodiment 5

Figure 11:
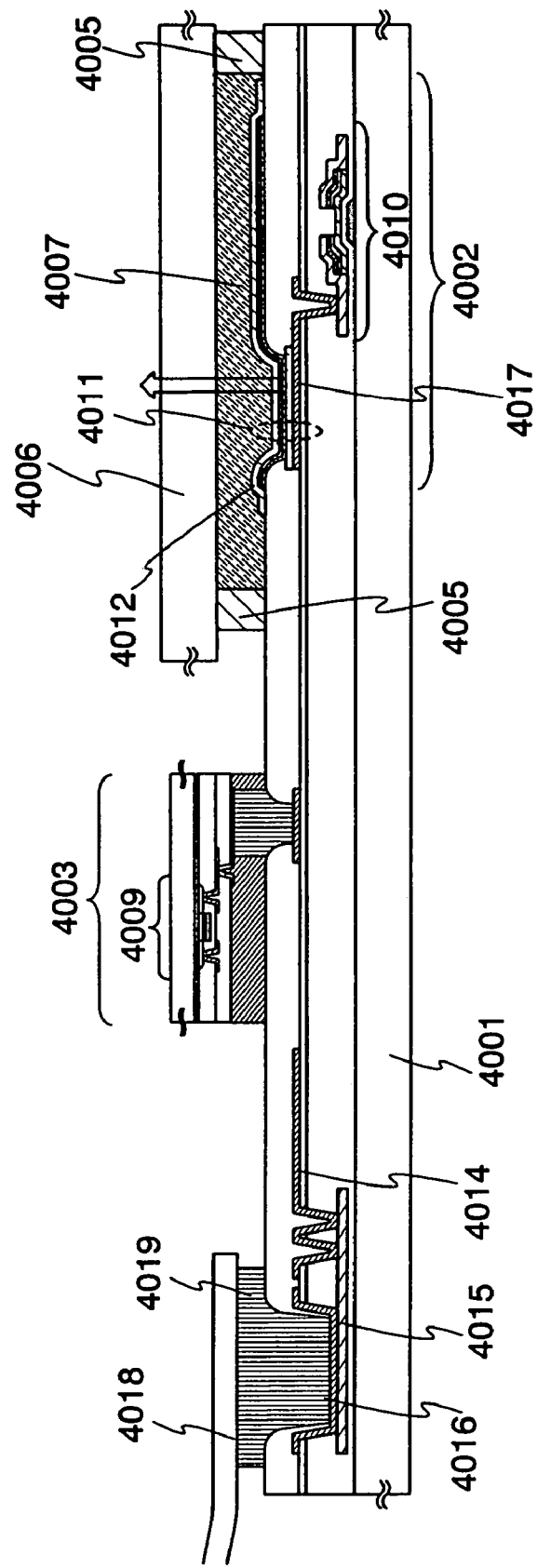
FIG. 11 is a cross-sectional view of a light emitting device of the invention. (Embodiment 5)

A panel of an example of a display device of the present invention will be described in this embodiment with reference to FIG. 11. FIG. 11 shows a cross-sectional view of the panel in which a semi-amorphous transistor and a light emitting element formed over a first substrate are sealed between a second substrate with a sealing member.

A pixel portion 4002 and a scan line driver circuit on a first substrate 4001 have a plurality of transistors. A transistor 4010 included in the pixel portion 4002 is shown in FIG. 11 as one example. The transistor 4010 is a transistor using a semi-amorphous semiconductor film.

A pixel electrode of a light-emitting element 4011 is electrically connected with a drain region of the transistor 4010 through a wiring 4017. A counter electrode of the light-emitting element 4011 and a transparent conductive film 4012 are electrically connected. The structure of the light-emitting element 4011 can be appropriately changed depending on a direction of light emitted from the light-emitting element 4011, a conductivity type of the transistor 4010, or the like.

In addition, each signal and potential given to a signal line driver circuit 4003 having a transistor 4009, which is formed separately and bonded to the first substrate 4001 with a pixel portion 4002 and so on, the scan line driver circuit and the pixel portion 4002 are supplied from a connection terminal 4016 through lead wirings 4014 and 4015.

In this embodiment, the connection terminal 4016 is formed of the same conductive film as a pixel electrode of the light-emitting element 4011. In addition, the lead wiring 4014 is formed of the same conductive film as a wiring 4017. The lead wiring 4015 is formed of the same conductive film as a gate electrode of the transistor 4010. The connection terminal 4016 is electrically connected with a terminal of an FPC 4018 through an anisotropic conductive film 4019.

The portion surrounded by the first and second substrates 4001 and 4006 and a sealing member 4005 is filled with a filler 4007. As the filler 4007, besides inert gas such as nitrogen or argon, an ultraviolet curable resin or a thermosetting resin can be used, for example PVC (polyvinyl chloride), acrylics, polyimide, an epoxy resin, a silicone resin, PVB (polyvinyl butyral), or EVA (ethylene vinyl acetate) can be used. A thermosetting resin is used as a filler in this embodiment.

In order for the filler 4007 to contact with a hygroscopic material (preferably barium oxide) or to a material that can absorb oxygen, a depression is provided at a second substrate 4006 and a hygroscopic material or a material that can absorb oxygen may be provided in the depression. Deterioration of the light-emitting element 4011 can be suppressed by providing a hygroscopic material or a material that can absorb oxygen.

This embodiment can be freely combined with any one of the above embodiment mode and embodiments 1 to 4.

Embodiment 6

Figure 12:
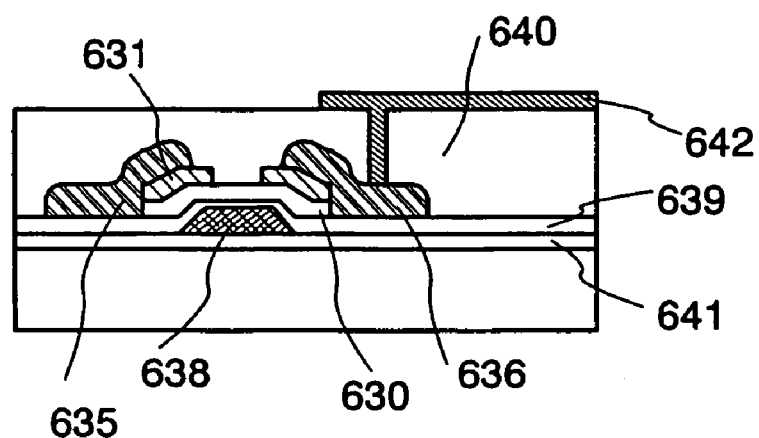
FIG. 12 is a cross-sectional view of an example of a TFT of the invention. (Embodiment 6)

In this embodiment, an example of using an organic semiconductor film as an active layer will be described with reference to FIG. 12

A base insulating film 641 is formed over a substrate, and a gate electrode 638 is formed thereover. Subsequently, a gate insulating film 639 is formed, and an organic semiconductor film 630 is formed. After a charge transport layer 631 is formed, a source electrode 635 and a drain electrode 636 are formed.

Subsequently, an interlayer insulating film 640 is formed using a flat insulating film (a SiOx film including an alkyl group) formed by an application method using a siloxane polymer. Further, after a contact hole reaching the drain electrode-636 is formed, a pixel electrode 642 is formed.

For the gate electrode 638, a conductive material typified by a metal or an alloy obtained by sputtering method can be used.

Further, as the gate insulating film 639, a silicon oxide, a silicon nitride, or a material containing a silicon nitride oxide as the main component, which is obtained by PECVD, can be used. Further, the gate insulating film 639 may be a SiOx including an alkyl group formed by an application method using a siloxane polymer.

For the organic semiconductor film 630, a material comprising carbon or allotropes (aside from a diamond) of carbon at a quantity can be used. The material which has charge carrier mobility of $10^{-3}$ $cm^2/V \cdot s$ or more in room temperature (20 degrees Celsius) can be used, and the examples are an aromatic of pi electron conjugate system, a chain compound, an organic and organosilicon compound. Specifically, pentacene, tetracene, thiophen oligomers, phenylenes, a phthalocyanine compound, poly acetylenes, polythiophenes, cyanine dye are given as examples.

Further, as to the charge transport layer 631, triphenyl diamine serving as a hole transport layer and oxadiazole serving as an electron transport layer can be used.

As to a material of a source electrode 635 and a drain electrode 636, an organic material such as polyaniline or polythiophene which can be made into a film by an application method or conductive ink can be used.

Subsequently, a pixel electrode (not shown) that is to be an anode or a cathode of a light emitting element, an EL layer (not shown) and a counter electrode (not shown) are formed in order. The EL layer is formed by using the vapor deposition system shown in FIG. 1.

Unevenness due to a gate electrode 638, an organic semiconductor film 630, a source electrode 635, drain electrode 636 and the like can be eliminated by planarizing the interlayer insulating film 640 formed by an application method; thus, shorted circuit of the light emitting element can be avoided.

This embodiment can be freely combined with any constitution shown in Embodiment Mode or Embodiments 1 to 5.

Embodiment 7

A semi-amorphous TFT that can be used in the present invention can be either an n-type TFT or a p-type TFT. The semi-amorphous TFT is preferably an n-type TFT since an n-type semi-amorphous TFT has higher mobility and is suitable for a pixel of a light-emitting device. In this embodiment, a cross-sectional structure of a pixel will be explained using an example of an n-type driving TFT.

Figure 13:
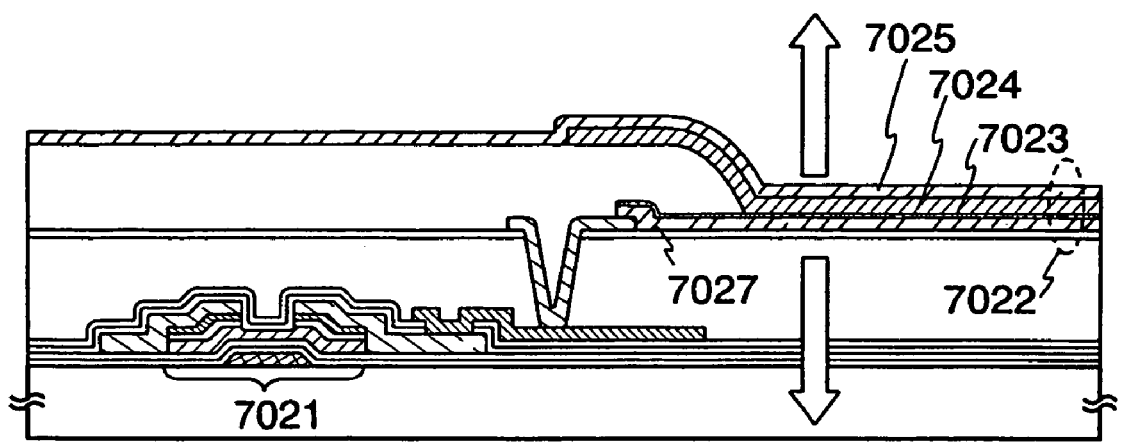
FIG. 13 is a cross-sectional view of a light emitting device of the invention. (Embodiment 7)

FIG. 13 is a cross-sectional view of a pixel used in the case where a driving TFT 7021 is an n-type TFT, and light generated in a light-emitting element 7022 emits passing through both an anode 7025 and a cathode 7023. In FIG. 13, the cathode 7023 of the light-emitting element 7022 is formed over a transparent conductive film 7027 electrically connected to the driving TFT 7021, and an EL layer 7024 and an anode 7025 are formed sequentially over the cathode 7023. As the cathode 7023, a known material can be used as long as it is a conductive film having a small work function. The cathode 7023 is formed to have a thickness that can transmit light. For example, Al having a thickness of 20 nm can be used as the cathode 7023. The EL layer 7024 may be formed by a single layer or a lamination layer. The anode 7025 can be formed by a transparent conductive film.

The light-emitting element 7022 the overlap region of the cathode 7023, the EL layer 7024 and the anode 7025. In the pixel shown in FIG. 13, light generated in the light-emitting element 7022 emits passing through both the anode 7025 and the cathode 7023 as denoted by outline arrows.

The structure in which the driving TFT is electrically connected to a light-emitting element is explained in this embodiment. A current control TFT may be formed between the driving TFT and the light-emitting element, and connected with them.

In a pixel shown in FIG. 13, a protective film can be formed to cover the light-emitting element 7022. As the protective film, a film, which is hard to penetrate substances such as moisture or oxygen that lead to deterioration of the light-emitting element, can be used. Typically, a DLC film, a carbon nitride film, a silicon nitride film formed by RF sputtering or the like is preferably used. Alternatively, the protective film can be formed by stacking the foregoing film that is hard to penetrate substances such as moisture or oxygen and a film that is easier to penetrate substances such as moisture or oxygen compared to the foregoing film.

In FIG. 13, in order to emit light from a cathode, an ITO film that has less work function by adding with Li can be used besides a thin film as the cathode.

This embodiment can be freely combined with any one of the structures shown in Embodiment Mode and Embodiments 1 to 6.

Embodiment 8

A display device and an electronic device of the present invention include a video camera, a digital camera, a goggle type display. (head mounted display), a navigation system, an audio reproducing device (a car audio, an audio component, and the like), a laptop computer, a game machine, a portable information terminal (a mobile computer, a cellular phone, a portable game machine, an electronic book, or the like), an image reproducing device (specifically a device capable of producing a recording medium such as a Digital Versatile Disc (DVD) and having a display device that can display the image) and the like. Especially, it is preferable to apply the invention to a large-sized television with a large screen or the like. Specific examples of the electronic devices are shown in FIGS. 15A to 15D.

Figure 15A:
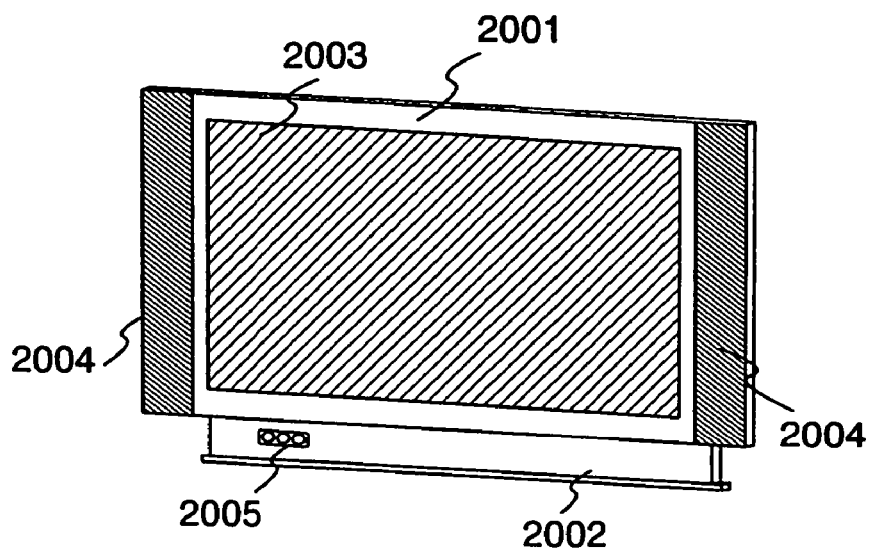
FIGS. 15A to 15D show examples of electronic devices of the invention. (Embodiment 8)

FIG. 15A is a large-sized display device with a large screen of 22 inches to 50 inches, which includes a chassis 2001, a support 2002, a display area 2003, a speaker portion 2004, and a video input terminal 2005. The display device includes every display devices for displaying information for a personal computer, for a TV broadcast reception, and the like.

Figure 15B:
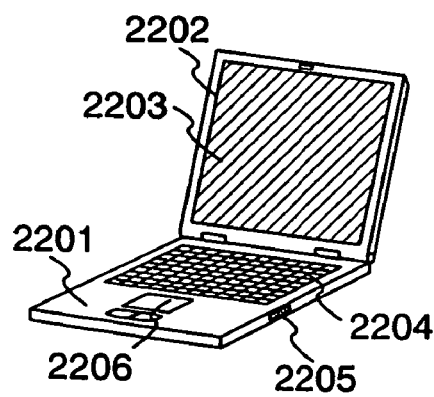

FIG. 15B is a laptop computer, which includes a main body 2201, a chassis 2202, a display area 2203, a keyboard 2204, an external connection port 2205, a pointing mouse 2206, and the like.

Figure 15C:
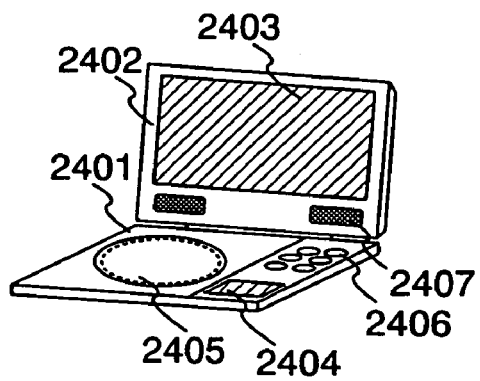

FIG. 15C is a portable image reproduction device equipped with a recording medium (specifically, a DVD player), which includes a main body 2401, a chassis 2402, a display area A 2403, a display area B 2404, a recording medium (a DVD players and the like) reading portion 2405, operation keys 2406, speaker portions 2407, and the like. The display area A 2403 mainly displays image information whereas the display area B 2404 mainly displays text information. The image reproduction device equipped with a recording medium includes home video game machines and the like.

Figure 15D:
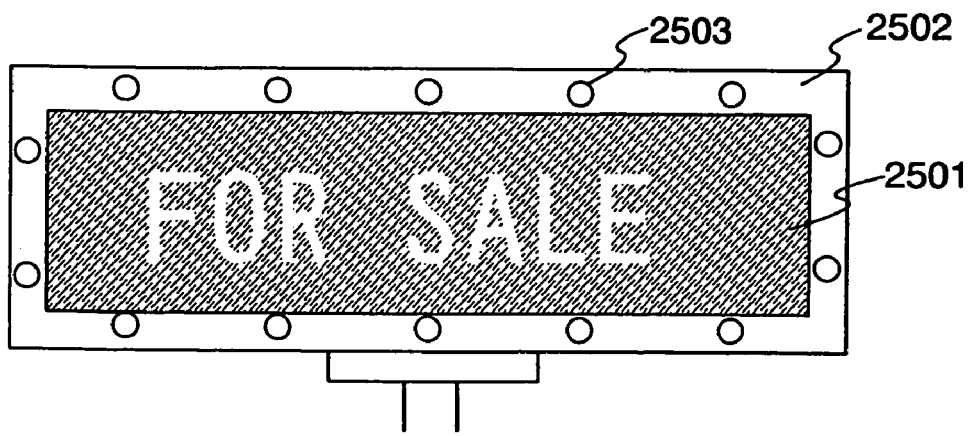

FIG. 15D is a display board such as an advertisement board, which includes a display area 2501, a chassis 2502, a lighting part 2503, for example, an LED light, and the like.

As described above, the application range of the invention is extremely wide; therefore, the invention can be used to the electronic devices of every field. In addition, the electronic devices shown in this embodiment can use any one of configurations shown in Embodiment Mode and Embodiments 1 to 7.

Thus, even in a large substrate, a film with uniform thickness can be formed entirely over the substrate. Further, the manufacturing cost of a light emitting devie can be markedly reduced by using an amorphous semiconductor film or a semi-amorphous semiconductor film, or an organic semiconductor film as an active layer of a TFT.

Moreover, when a semi-amorphous semiconductor film is used as an active layer of a TFT, a driver circuit can be fabricated simultaneously as forming TFTs in pixel portion, and a system on panel using light-emitting elements can be obtained without complicating the fabrication process of TFTs.

What is claimed is:

1. A manufacturing method of a light emitting device comprising the steps of:
    forming a gate electrode over a substrate;
    forming and stacking an insulator film and a semiconductor film over the gate electrode, and thereafter patterning the semiconductor film by using a pattern to form a patterned semiconductor film;
    forming a drain electrode over the semiconductor film;
    forming a first electrode in contact with the drain electrode;
    depositing a material containing an organic compound by a source of a vapor deposition provided opposite the substrate;
    forming a film containing the organic compound over the first electrode; and
    forming a second electrode over the film containing the organic compound,
    wherein the source of the vapor deposition is moved parallel to the first electrode and the semiconductor film includes an amorphous semiconductor film, a semi-amorphous semiconductor film or an organic semiconductor film, and
    wherein the pattern is formed by selectively discharging a composition containing an organic resin.

2. The manufacturing method of the light emitting device according to claim 1,
    wherein a plurality of pixel portions are arranged on the substrate.

3. The manufacturing method of the light emitting device according to claim 1, wherein a distance between the source of the vapor deposition and the substrate is 30 cm or below.

4. The manufacturing method of the light emitting device according to claim 1,
    wherein the source of the vapor deposition is moved in an X-direction, a Y-direction and a Z-direction.

5. The manufacturing method of the light emitting device according to claim 1,
    wherein a plurality of containers are provided for the source of the vapor deposition, and deposition materials are atomized by colliding the deposition materials with each other in a plurality of directions by simultaneously heating the plurality of containers.

6. The manufacturing method of the light emitting device according to claim 1,
    wherein the first electrode is a cathode or an anode of a light emitting element which is electrically connected to the thin film transistor.

7. The manufacturing method of the light emitting device according to claim 1,
    wherein the amorphous semiconductor or the semi-amorphous semiconductor film is formed by CVD using a silicide gas.

8. A manufacturing method of a light emitting device comprising the steps of:
    forming a first conductor over a substrate;
    forming and stacking a first insulator film and a first semiconductor film over the first conductor, and thereafter patterning the first semiconductor film by using a first pattern to form a patterned first semiconductor film;
    forming a second insulator film in contact with the patterned first semiconductor film, and thereafter patterning the second insulator film by using a second pattern;
    forming and stacking a second semiconductor film and a third semiconductor film over the second insulator film;
    forming a second conductor in contact with the third semiconductor film, and thereafter forming a thin film transistor by patterning the second semiconductor film and the third semiconductor film using the second conductor as a mask;
    forming a first electrode in contact with the second conductor;
    depositing a material containing an organic compound by a source of a vapor deposition provided opposite the substrate to form a film containing the organic compound over the first electrode by moving the source of the vapor deposition; and
    forming a second electrode over the film containing the organic compound;

wherein semi-amorphous semiconductor films are formed as the first semiconductor film and the third semiconductor film, wherein the first pattern and the second pattern are formed by selectively discharging a first composition containing an organic resin, and wherein the first conductor and the second conductor are formed by selectively discharging a second composition containing a conductive material.

9. The manufacturing method of the light emitting device according to claim 8, wherein impurity elements which provide n-type conductivity are doped into the second semiconductor film and the third semiconductor film.

10. The manufacturing method of the light emitting device according to claim 8, wherein the second composition contains silver, gold, copper or indium tin oxide.

11. The manufacturing method of the light emitting device according to claim 8, wherein the first pattern and the second pattern comprise a photosensitive agent dissolved in a solvent.

12. A manufacturing method of a light emitting device comprising the steps of:

forming a first conductor over a substrate;

forming and stacking a first insulator film and a first semiconductor film over the first conductor, and thereafter patterning the first semiconductor film by using a first pattern to form a patterned semiconductor film;

forming a second insulator film in contact with the patterned first semiconductor film, and thereafter patterning the second insulator film by using a second pattern;

forming a second semiconductor film over the second insulator film;

forming a second conductor in contact with the second semiconductor film, and thereafter forming a thin film transistor by patterning the second semiconductor film using the second conductor as a mask;

forming a first electrode in contact with the second conductor;

depositing a material containing an organic compound by a source of a vapor deposition provided opposite the substrate to form a film containing the organic compound over the first electrode by moving the source of the vapor deposition; and forming a second electrode over the film containing the organic compound;

wherein semi-amorphous semiconductor films are formed as the first semiconductor film and the second semiconductor film, wherein the first pattern and the second pattern are formed by selectively discharging a first composition containing an organic resin, and wherein the first conductor and the second conductor are formed by selectively discharging a second composition containing a conductive material.

13. The manufacturing method of the light emitting device according to claim 12, wherein impurity elements which provide n-type conductivity are doped into the second semiconductor film.

14. The manufacturing method of the light emitting device according to claim 12, wherein the second composition contains silver, gold, copper, or indium tin oxide.

15. The manufacturing method of the light emitting device according to claim 12, wherein the first pattern and the second pattern comprise a photosensitive agent dissolved in a solvent.

16. A manufacturing method of a light emitting device comprising the steps of:

forming a first conductor over a substrate;

forming and stacking a first insulator film and a first semiconductor film over the first conductor;

forming a second insulator film in contact with the first semiconductor film;

forming a second semiconductor film over the second insulator film;

forming a second conductor in contact with the second semiconductor film, and thereafter forming a thin film transistor by patterning the second semiconductor film using the second conductor as a mask;

forming a first electrode in contact with the second conductor;

depositing a material containing an organic compound by a source of a vapor deposition provided opposite the substrate to form a film containing the organic compound over the first electrode by moving the source of the vapor deposition; and forming a second electrode over the film containing the organic compound;

wherein semi-amorphous semiconductor films are formed as the first semiconductor film and the second semiconductor film, and wherein the first conductor and the second conductor are formed by selectively discharging a composition containing a conductive material.

17. The manufacturing method of the light emitting device according to claim 16, wherein impurity elements which provide n-type conductivity are doped into the second semiconductor film.

18. The manufacturing method of the light emitting device according to claim 16, wherein the composition contains silver, gold, copper or indium tin oxide.

* * * * *